(12) United States Patent
Zang et al.

(10) Patent No.: US 10,629,707 B2
(45) Date of Patent: Apr. 21, 2020

(54) FINFET STRUCTURE WITH BULBOUS UPPER INSULATIVE CAP PORTION TO PROTECT GATE HEIGHT, AND RELATED METHOD

(71) Applicant: GLOBALFOUNDRIES INC., Grand Cayman (KY)

(72) Inventors: Hui Zang, Guilderland, NY (US); Ruilong Xie, Schenectady, NY (US); Jiehui Shu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/987,101

(22) Filed: May 23, 2018

(65) Prior Publication Data
US 2019/0363180 A1 Nov. 28, 2019

(51) Int. Cl.
*H01L 29/78* (2006.01)
*H01L 29/41* (2006.01)
*H01L 29/66* (2006.01)
*H01L 21/02* (2006.01)
*H01L 29/417* (2006.01)
*H01L 29/08* (2006.01)

(52) U.S. Cl.
CPC .. *H01L 29/66795* (2013.01); *H01L 21/02381* (2013.01); *H01L 29/0847* (2013.01); *H01L 29/41783* (2013.01); *H01L 29/7855* (2013.01)

(58) Field of Classification Search
CPC ............ H01L 29/785; H01L 29/66795; H01L 27/0886; H01L 27/0924; H01L 29/0847; H01L 29/41783; H01L 29/41791; H01L 29/7855
See application file for complete search history.

(56) References Cited

U.S. PATENT DOCUMENTS

| | | |
|---|---|---|
| 9,129,986 B2 | 9/2015 | Zang et al. |
| 9,455,254 B2 | 9/2016 | Xie et al. |
| 2018/0083002 A1* | 3/2018 | Kim .................. H01L 29/66795 |

OTHER PUBLICATIONS

U.S. Appl. No. 15/976,326, Methods, Apparatus, and System for a Semiconductor Device Coprising Gates With Short Heights, filed May 10, 2018, 59 pages.

* cited by examiner

*Primary Examiner* — Tucker J Wright
*Assistant Examiner* — Scott Stowe
(74) *Attorney, Agent, or Firm* — Francois Pagette; Hoffman Warnick LLC

(57) ABSTRACT

A finFET structure includes an insulative cap over each gate in a vicinity of a first and second self-aligned contact (SAC) to source/drain regions thereof. The insulative cap has a bulbous upper insulative cap portion selectively grown to protect gate height loss during SAC opening formation. The bulbous upper insulative cap portion may be over just gates in the vicinity of the S/D regions, and optionally, over gates in the vicinity of a gate contact.

18 Claims, 20 Drawing Sheets

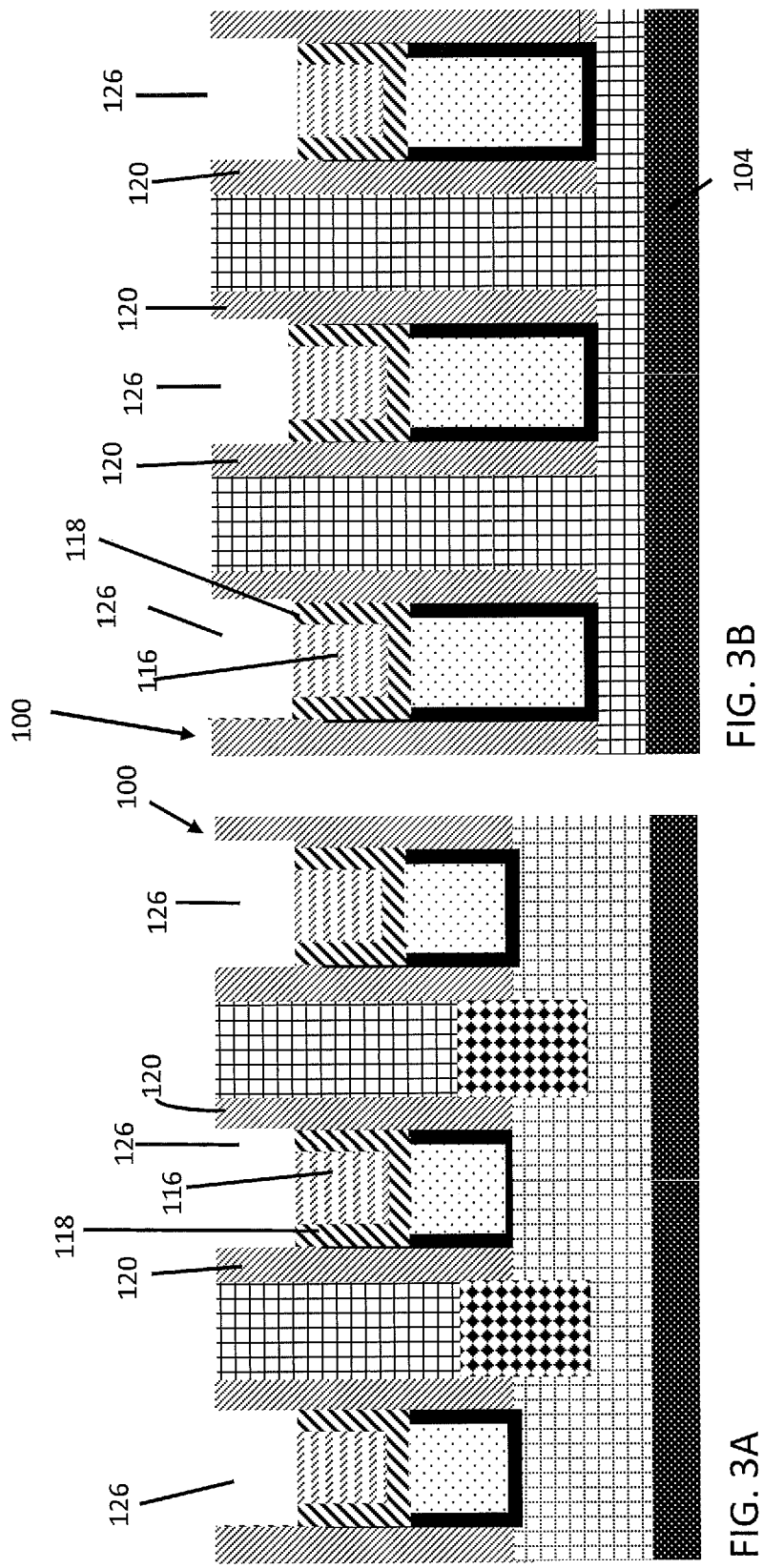

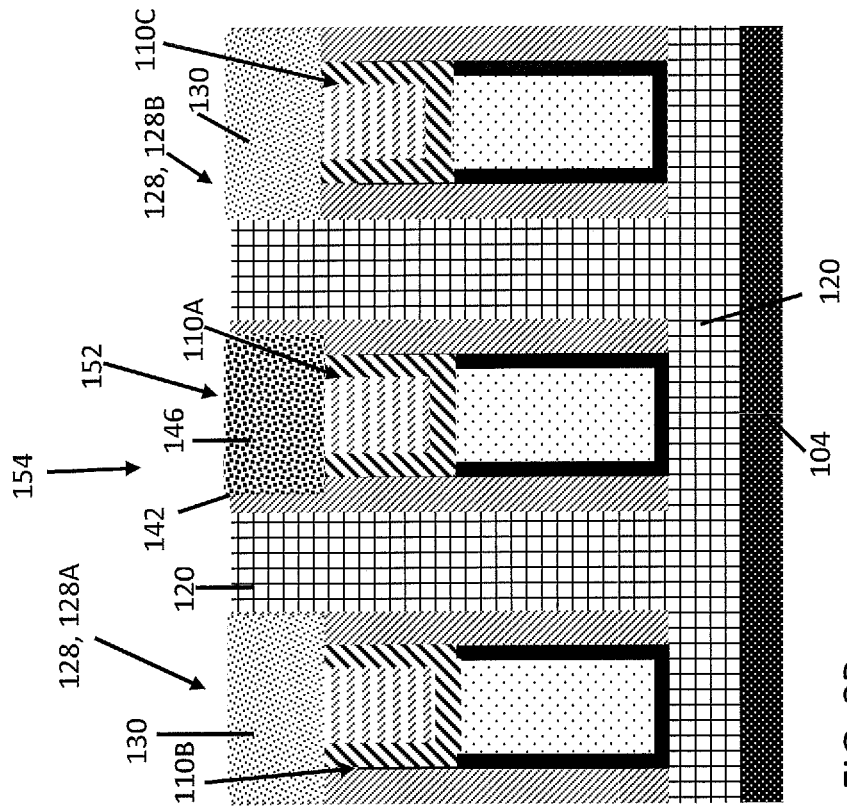
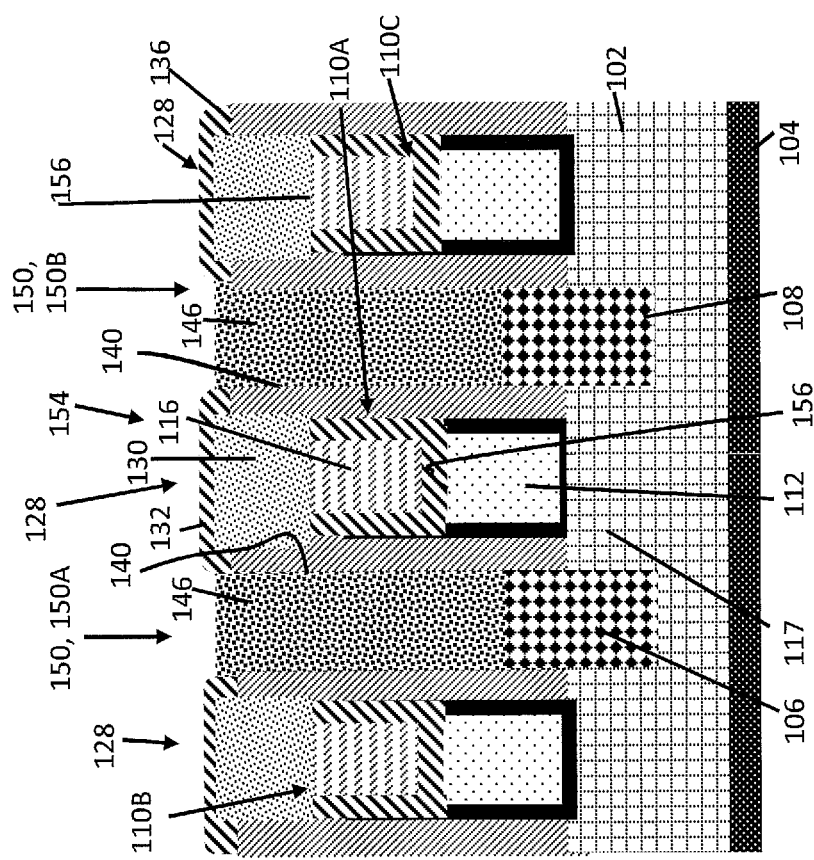

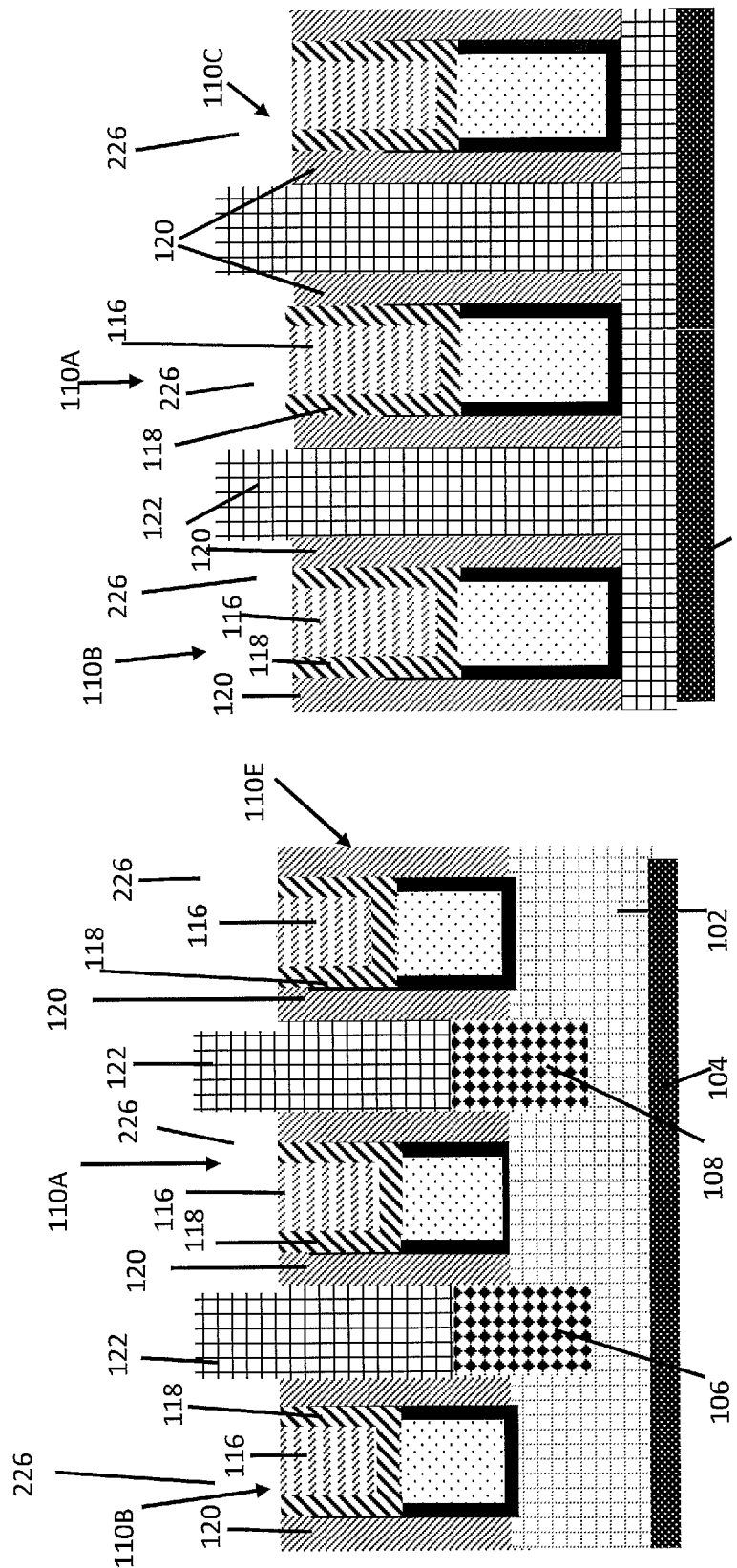

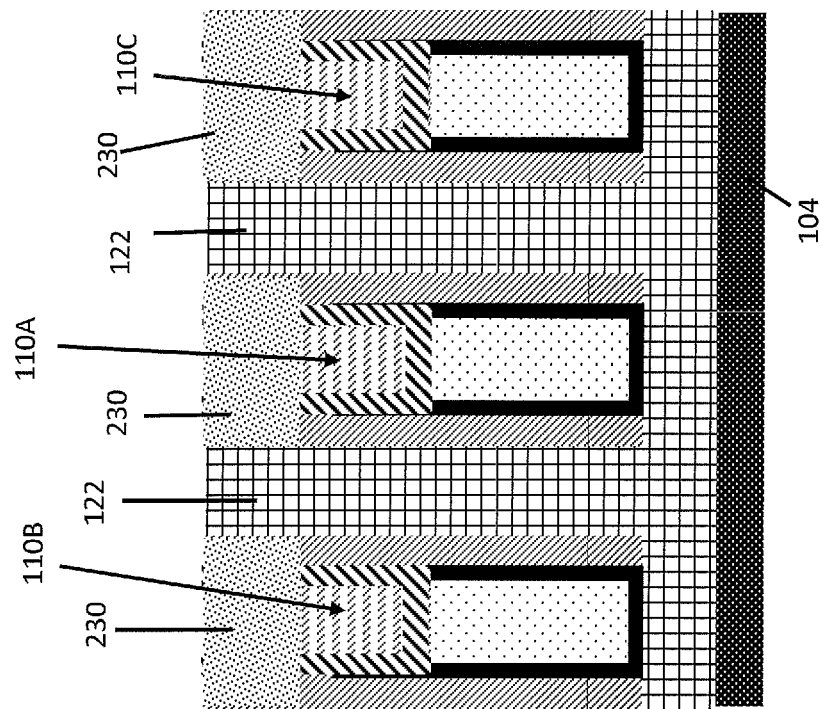
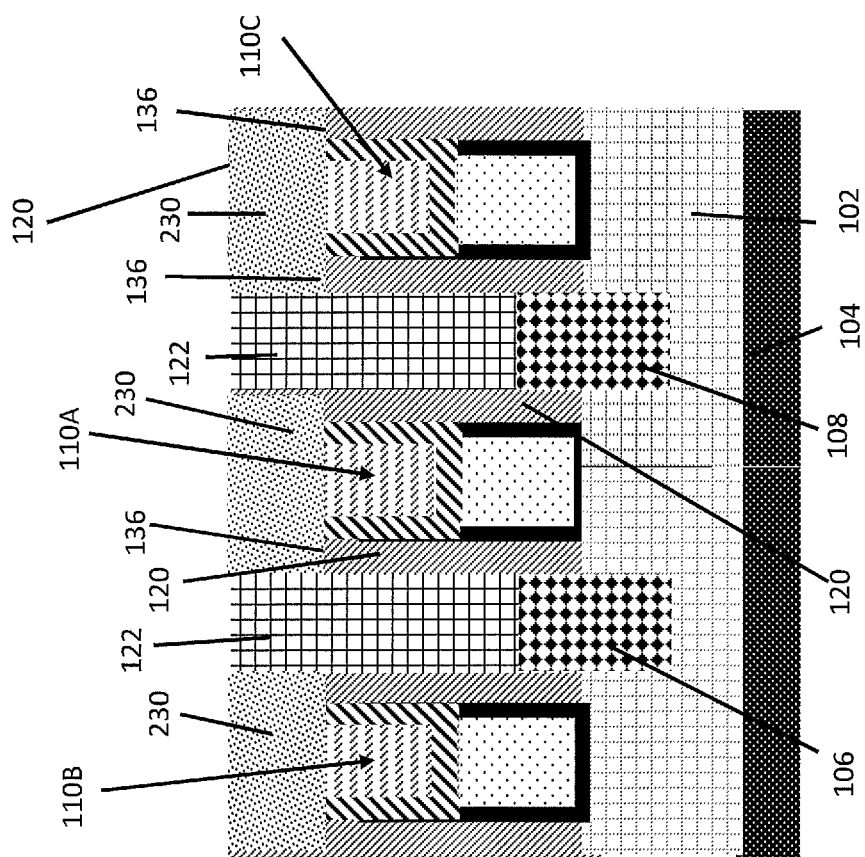
FIG. 10B
FIG. 10A

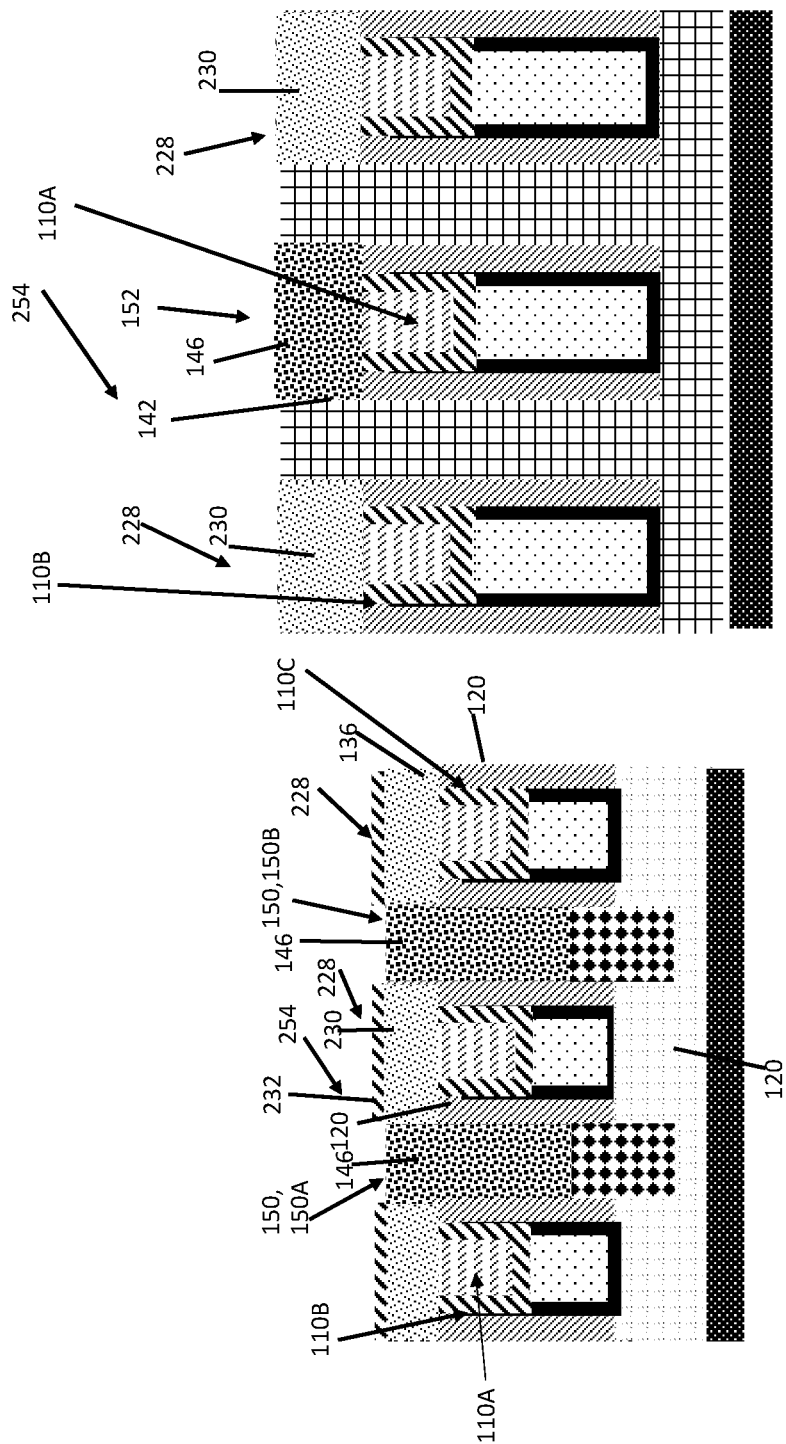

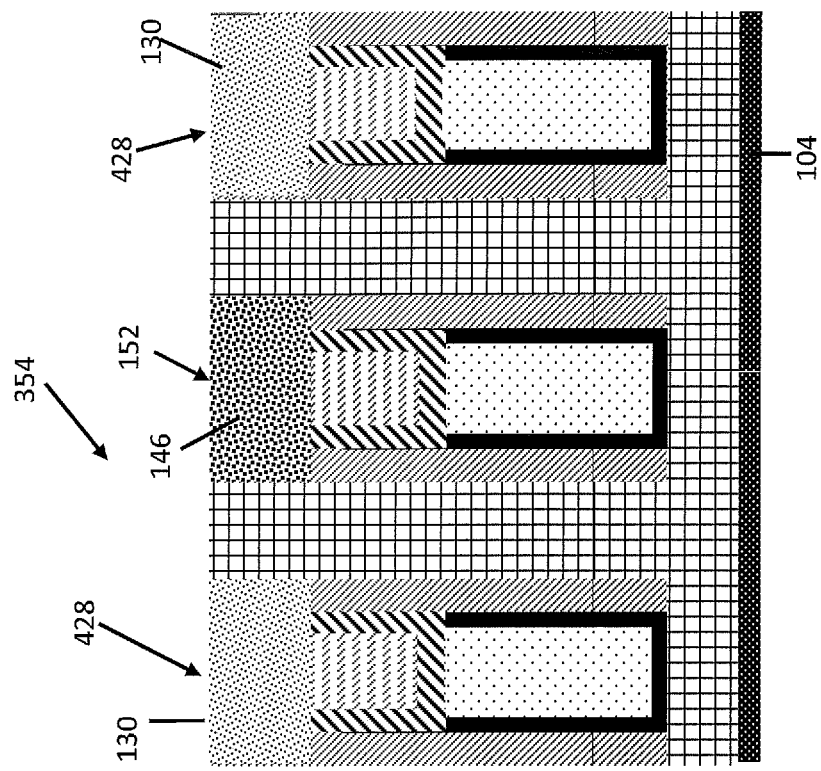
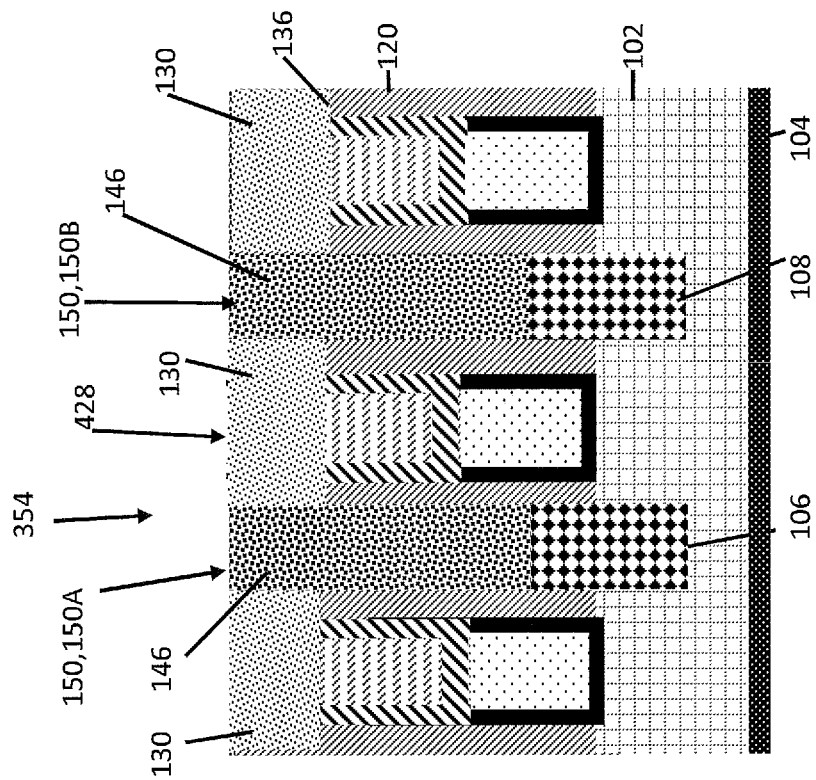
FIG 16A
FIG. 16B

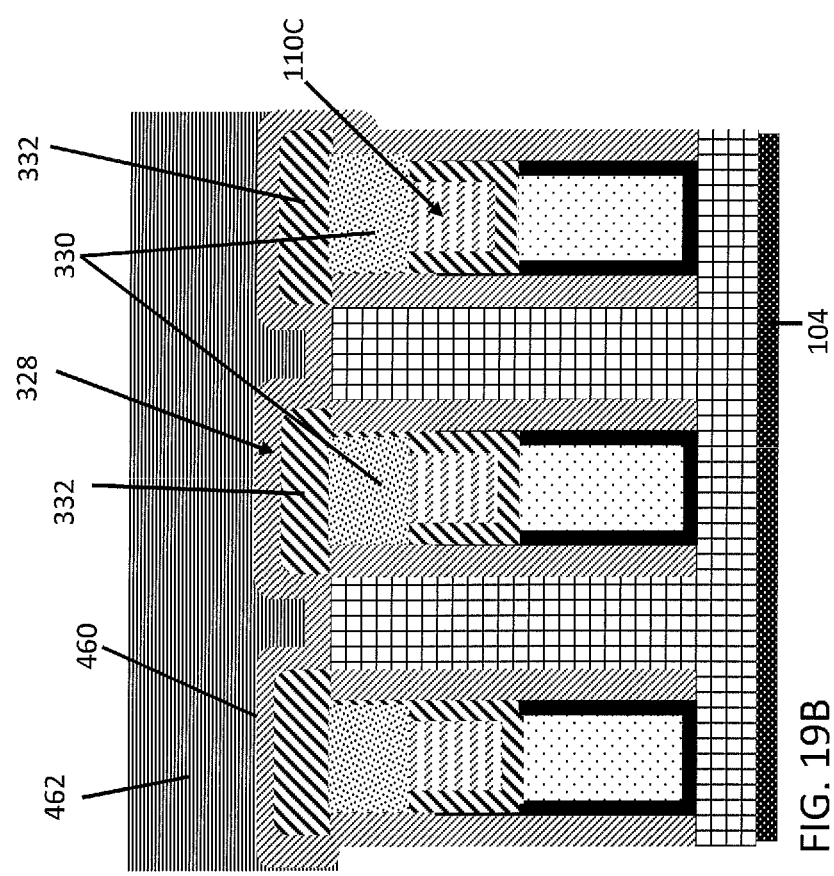
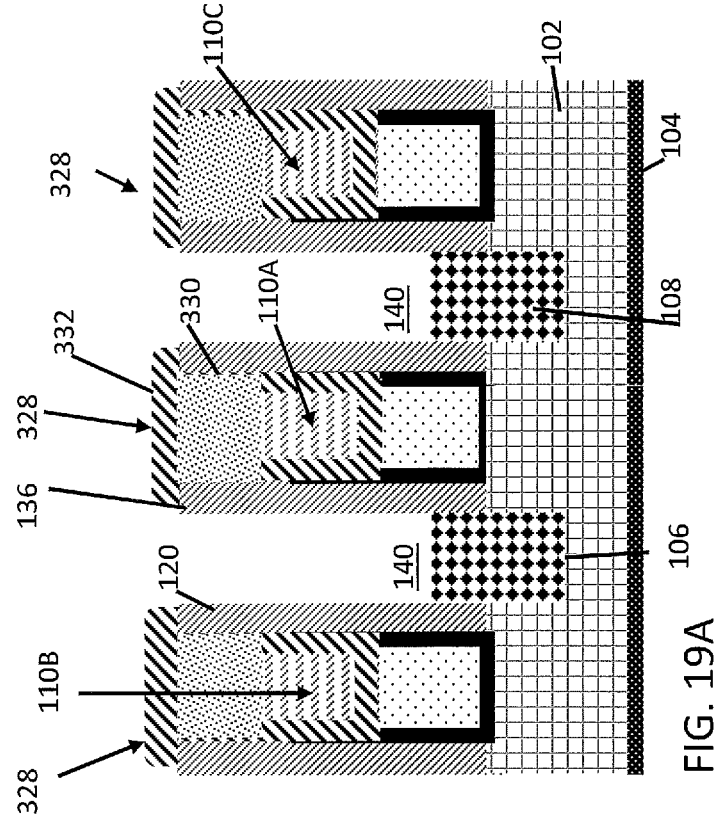
FIG. 19B
FIG. 19A

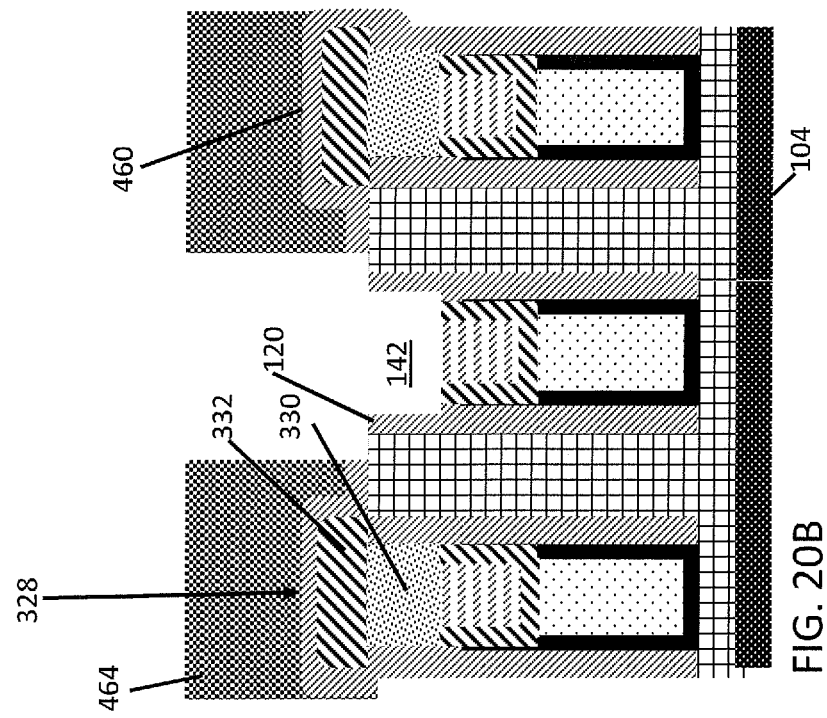
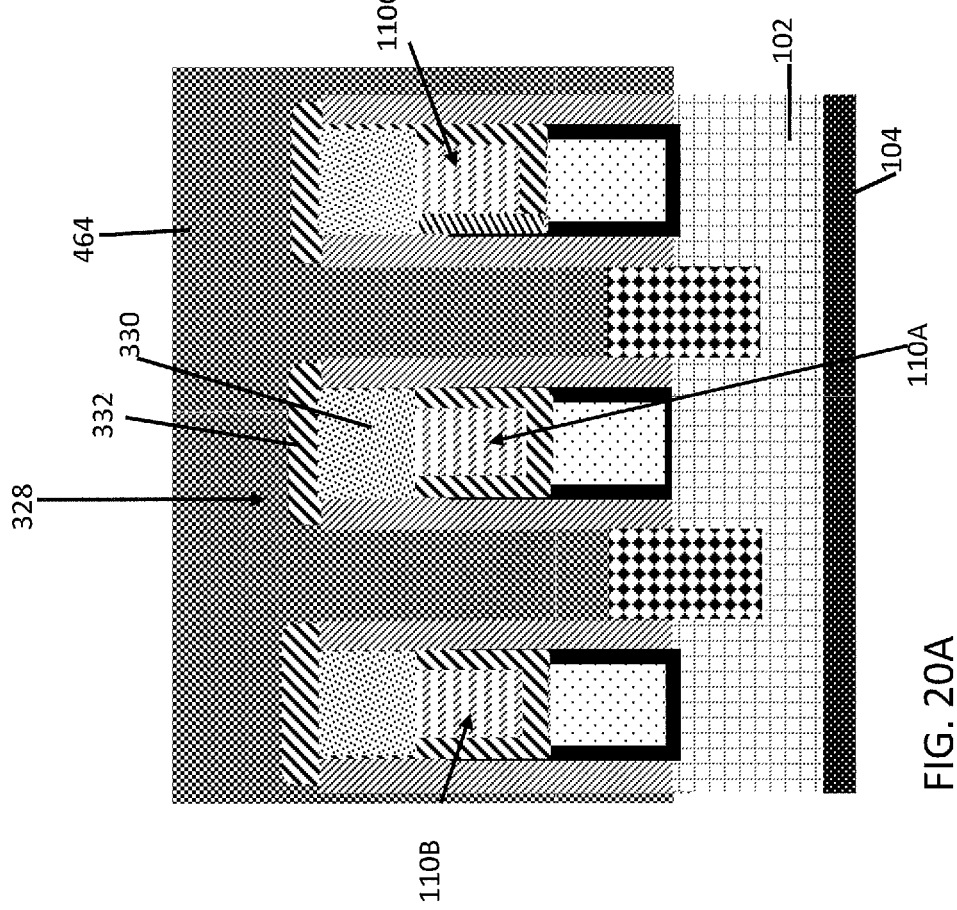

FINFET STRUCTURE WITH BULBOUS UPPER INSULATIVE CAP PORTION TO PROTECT GATE HEIGHT, AND RELATED METHOD

BACKGROUND

The present disclosure relates to integrated circuits, and more specifically, to a method and resulting structure for forming self-aligned contacts for a fin-type field effect transistor (finFET) structure with reduced gate height loss.

FinFET structures are widely used in the integrated circuit (IC) industry. As scaling of ICs has continued, it has become progressively harder to align contacts to parts of the finFET structure while maintaining the integrity of other structure. For example, current approaches for forming via openings for self-aligned contacts, e.g., applied at the 7 nanometer (nm) technology node, result in unacceptable gate height loss for the finFET structure.

SUMMARY

A first aspect of the disclosure is directed to a fin-type field effect transistor (finFET) structure, comprising: a semiconductor fin on a substrate; a first source/drain (S/D) region defined in the semiconductor fin; a second source/drain (S/D) region defined in the semiconductor fin, the second S/D region spaced from the first source/drain region; a first, second and third gate extending across the semiconductor fin, each gate including a work function metal having a metal plug in a barrier liner thereover, wherein the first gate extends across the semiconductor fin between the first source/drain region and the second source/drain region; a sidewall spacer about the first gate; a first self-aligned contact (SAC) extending to the first source/drain region between the first and second gate; a second self-aligned contact (SAC) extending to the second source/drain region between the first and third gate; and a first insulative cap over each gate in a vicinity of the first SAC and the second SAC, the first insulative cap having a bulbous upper insulative cap portion.

A second aspect of the disclosure includes a method comprising: providing a preliminary structure including: a semiconductor fin on a substrate, a first source/drain (S/D) region defined in the semiconductor fin, a second source/drain (S/D) region defined in the semiconductor fin, the second S/D region spaced from the first source/drain region, a gate extending across the semiconductor fin, the gate including a work function metal having a metal plug in a barrier liner thereover, wherein the gate extends across the semiconductor fin between the first S/D region and the second S/D region, and a sidewall spacer about the gate; forming a gate plug recess in at least the metal plug and the barrier liner within the sidewall spacer over the gate in each of: a first region between the first and second S/D regions, and a second region including a location for a gate contact; forming a lower insulative cap portion over each gate plug recess, and planarizing; forming a bulbous upper insulative cap portion on each lower insulative cap portion in at least the first region; forming self-aligned contact (SAC) openings to each of the first and second S/D regions by etching a trench silicide region from over each of the first and second S/D regions; forming a gate contact opening by removing the lower insulative cap portion from over the gate in the second region; and depositing a conductor in the SAC openings and the gate contact opening to form SACs to the first and second S/D regions and the gate contact to the first gate.

A third aspect of the disclosure related to a fin-type field effect transistor (finFET) structure, comprising: a semiconductor fin on a substrate; a first source/drain (S/D) region defined in the semiconductor fin; a second source/drain (S/D) region defined in the semiconductor fin, the second S/D region spaced from the first source/drain region; a first, second and third metal gate extending across the semiconductor fin, each metal gate including a work function metal having a tungsten plug in a titanium nitride (TiN) barrier liner thereover, wherein the first metal gate extends across the semiconductor fin between the first source/drain region and the second source/drain region; a silicon nitride sidewall spacer about the first metal gate; a first self-aligned contact (SAC) extending to the first source/drain region between the first and second metal gate; a second self-aligned contact (SAC) extending to the second source/drain region between the first and third metal gate; a first silicon nitride (SiN) insulative cap over each metal gate in a vicinity of the first SAC and the second SAC, wherein the first (SiN) insulative cap has a selectively grown SiN bulbous upper insulative cap portion; a gate contact to the first metal gate at a distance from the first and second S/D regions; a second silicon nitride (SiN) insulative cap over the second metal gate in a vicinity of the gate contact; and a third silicon nitride (SiN) insulative cap over the third metal gate in the vicinity of the gate contact, wherein each of the second and third SiN insulative caps have a selectively grown SiN bulbous upper insulative cap portion.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 3A and 3B show cross-sectional views along line A-A and B-B, respectively, in FIG. 1, after part of a method according to embodiments of the disclosure.

FIGS. 8A and 8B show cross-sectional views along line A-A and B-B, respectively, in FIG. 1, after part of a method, and shows a finFET structure, according to embodiments of the disclosure.

FIGS. 9A and 9B show cross-sectional views along line A-A and B-B, respectively, in FIG. 1, after part of a method according to embodiments of the disclosure.

FIGS. 10A and 10B show cross-sectional views along line A-A and B-B, respectively, in FIG. 1, after part of a method according to embodiments of the disclosure.

FIGS. 11A and 11B show cross-sectional views along line A-A and B-B, respectively, in FIG. 1, after part of a method, and a finFET structure, according to embodiments of the disclosure.

FIGS. 16A and 16B show cross-sectional views along line A-A and B-B, respectively, in FIG. 1, after part of a method according to embodiments of the disclosure.

FIGS. 19A and 19B show cross-sectional views along line A-A and B-B, respectively, in FIG. 1, after part of a method according to embodiments of the disclosure.

FIGS. 20A and 20B show cross-sectional views along line A-A and B-B, respectively, in FIG. 1, after part of a method according to embodiments of the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide an advanced finFET self-aligned contact formation method using silicon nitride hard mask as a gate height loss preventer. Hence, the middle-of-line (MOL) integration method addresses significant gate height loss and improves contact to gate short yield margin.

Figure 1:
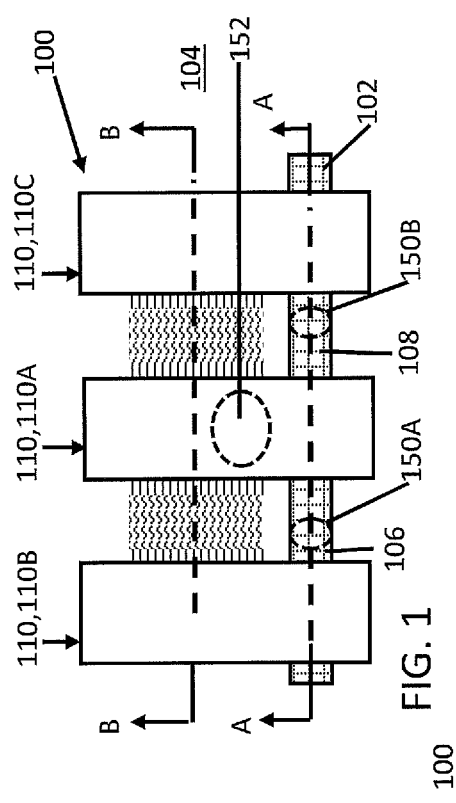
FIG. 1 shows a schematic plan view of a general layout of structure according to embodiments of the disclosure.

FIGS. 1-21B show various embodiments of a method according to embodiments of the disclosure, with FIGS. 8A-B, 11A-B, and 21A-B showing various embodiments of a fin FET structure according to embodiments of the disclosure. FIG. 1 shows a schematic plan view of a general layout of structure, and providing particular cross-sectional views for describing methods according to embodiments of the disclosure. In the following figures, those labeled "A" show a cross-sectional view along line A-A in FIG. 1 after the steps described, and those labeled "B" show a cross-sectional view along line B-B in FIG. 1 after the steps described. As will be observed, for example in FIGS. 1, 2A and 2B, cross-sectional view along line A-A in FIG. 1 shows a first region between first and second S/D regions 106, 108, and cross-sectional view along line B-B in FIG. 1 shows a second region (FIG. 3B), distanced from S/D regions 106, 108 along gate 110, and including a location for a gate contact 152 (FIG. 8B).

Figure 2B:
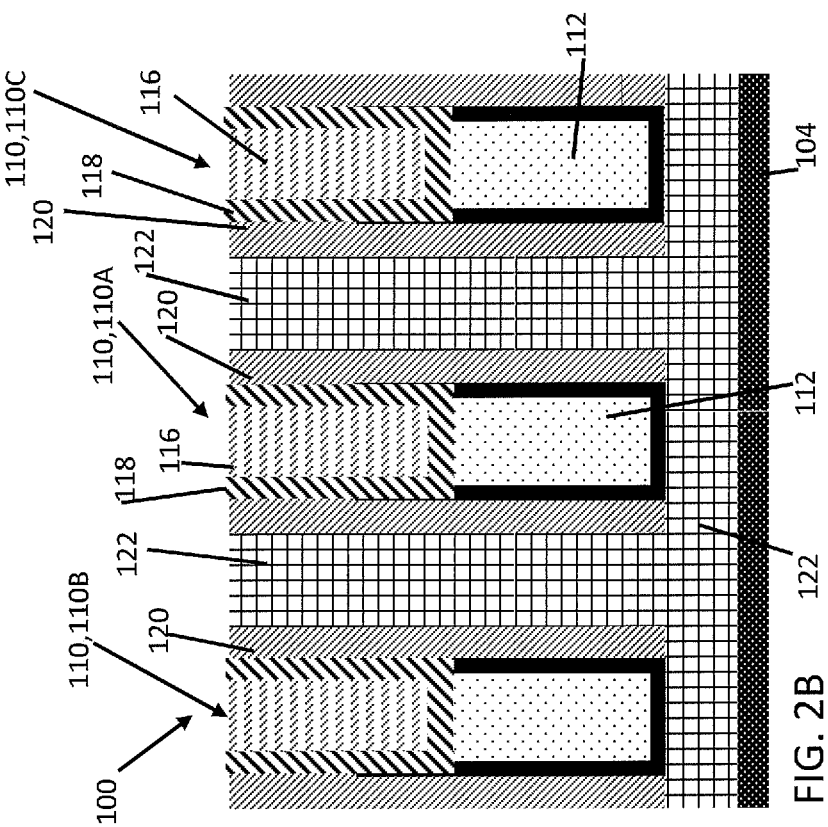
FIGS. 2A and 2B show cross-sectional views along line A-A and B-B, respectively, in FIG. 1, after part of a method according to embodiments of the disclosure.
Figure 2A:
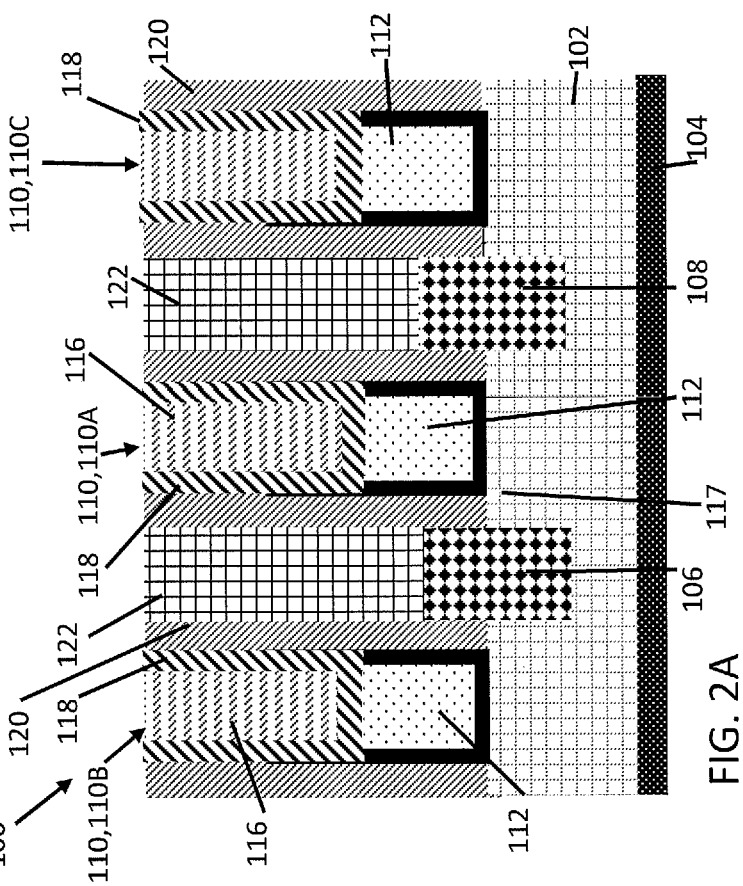

As shown in FIGS. 2A and 2B, a preliminary structure 100 may include a semiconductor fin 102 on a substrate 104. Fin 102 and semiconductor substrate 104 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. Fin 100 may be grown on substrate 104 or otherwise formed therefrom, e.g., by etching.

Preliminary structure 100 may also include a first source/drain (S/D) region 106 defined in semiconductor fin 104, and a second source/drain (S/D) region 108 defined in semiconductor fin 108. Second S/D region 108 is spaced from first S/D region 106, e.g., by a portion of semiconductor fin 104. S/D regions 106, 108 may be formed using any now known or later developed semiconductor processing. For example, S/D regions 106, 108 may be formed by doping semiconductor fin 104. Doping is the process of introducing impurities (dopants) into the semiconductor substrate, or elements formed on the semiconductor substrate, and is often performed with a mask (or previously-formed, elements in place) so that only certain areas of the substrate will be doped. For example, doping is used to form the source and drain regions of an FET. An ion implanter is typically employed for the actual implantation. An inert carrier gas such as nitrogen is usually used to bring in the impurity source (dopant). In addition thereto or as an alternative, S/D regions 106, 108 may be formed by epitaxial growing doped semiconductor material. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. In some embodiments, epitaxial growth processes may be selective to forming on semiconductor surfaces, and may not deposit material on dielectric surfaces, such as silicon dioxide or silicon nitride surfaces.

Preliminary structure 100 may also include a gate 110 extending across semiconductor fin 102. As understood in the art, IC structures are typically formed with many gates. Hence, in the drawings, a first gate 110A, a second gate 110B, and a third gate 110C, are shown. For purposes of description, first gate 110A is selected as the gate that is active and requires a gate contact, as will be described herein. Each gate 110 includes a work function metal (WFM) 112 having a metal plug 114 in a barrier liner 116 thereover. WFM 112 may include any now known or later developed WFM for the particular type, e.g., n-type or p-type, finFET desired. WFM 112 may be positioned within any now known or later liner (not labeled), e.g., a refractory metal liner. Metal plug 114 may include, for example, tungsten (W), and barrier liner 116 may include any now known or later developed refractory metal liner material such as but not limited to titanium nitride (TiN). As understood, and as shown in FIG. 1, first gate 110A extends across semiconductor fin 102 between first S/D region 106 and second S/D region 108, forming a channel region 117 (FIG. 2A) in semiconductor fin 102. A sidewall spacer 120 may be positioned about each gate 110. Sidewall spacer 120 may include any now known or later developed spacer material such as but not limited to silicon nitride (SiN). Preliminary structure 100 may also include a dielectric 122 that forms a cap over each S/D region 106, 108, e.g., of silicon oxide (SiO$_2$). The area over S/D regions 106, 108 is commonly referred to a trench silicide (TS) region. As shown in FIG. 2B, dielectric 122 may further isolate finFETs away from S/D regions 106, 108, e.g., as a trench isolation.

Preliminary structure 100 may be formed using any now known or later developed semiconductor fabrication techniques, e.g., photolithography, deposition, patterning, and etching. In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. "Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

FIGS. 3A and 3B show forming a gate plug recess 126 in at least metal plug 116 and barrier liner 118 within sidewall spacer 120 over gate 110 in each of: a first region (shown in FIG. 3A) between first and second S/D regions 106, 108, and a second region (shown in FIG. 3B). As will be described, the second region (FIG. 3B) includes a location for a gate contact 152 (FIG. 8B). As noted, cross-sectional view along line A-A in FIG. 1 shows the first region (FIG. 3A) between first and second S/D regions 106, 108, and cross-sectional view along line B-B in FIG. 1 shows a second region (FIG. 3B), distanced from S/D regions 106, 108. Gate plug recess 126 may be formed using any now known or later developed techniques, e.g., patterning a mask (not shown) to expose gate plug 116 and barrier liner 118, and etching. As a result of gate plug recess 126 formation, sidewall spacer 120 extends above gate plug 116 and barrier liner 118. The etching may include, for example, a RIE.

Figure 4B:
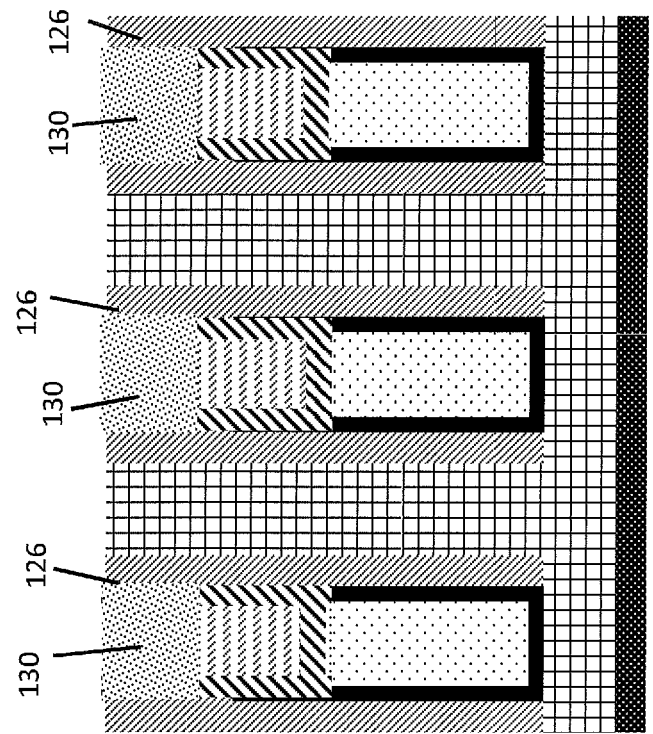
FIGS. 4A and 4B show cross-sectional views along line A-A and B-B, respectively, in FIG. 1, after part of a method according to embodiments of the disclosure.
Figure 4A:
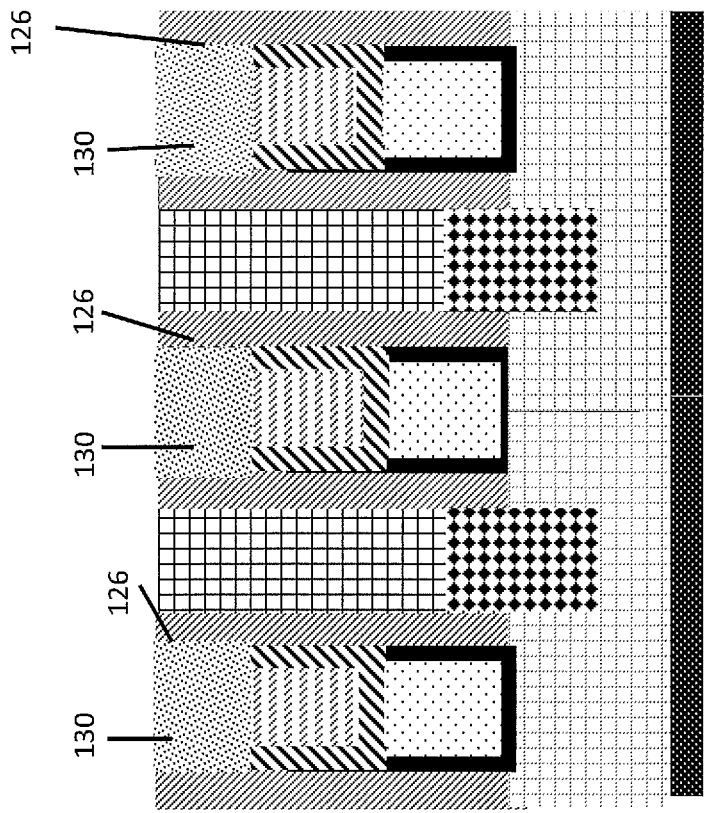

FIGS. 4A and 4B show forming a lower insulative cap portion 130 over each gate plug recess 126, and planarizing. As will be described, lower insulative cap portion 130 may form part of an insulative cap 128 that also includes a bulbous upper insulative cap portion 132 (FIG. 5A et seq.), according to various embodiments of the disclosure. Lower insulative cap portion 130 may include silicon nitride (SiN). Lower insulative cap portion 130 may be formed by depositing material, e.g., SiN, into gate plug recess 126 (FIGS. 3A and 3B). Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This process removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Figure 5B:
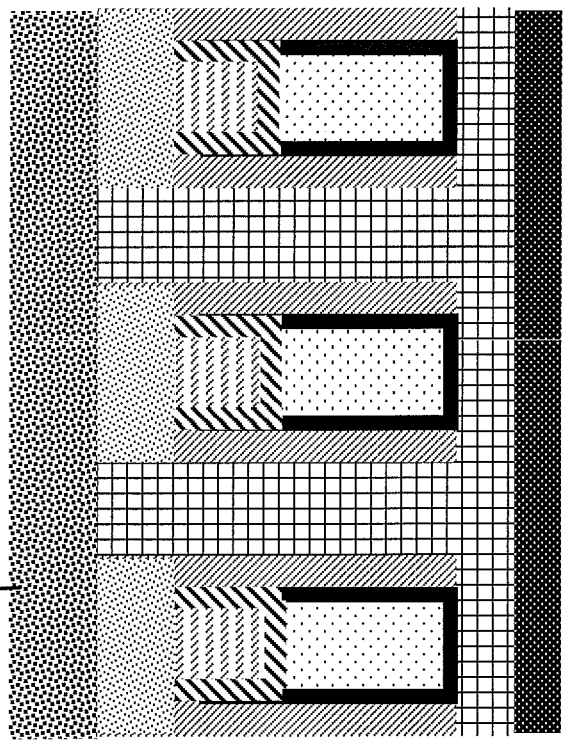
FIGS. 5A and 5B show cross-sectional views along line A-A and B-B, respectively, in FIG. 1, after part of a method according to embodiments of the disclosure.
Figure 5A:
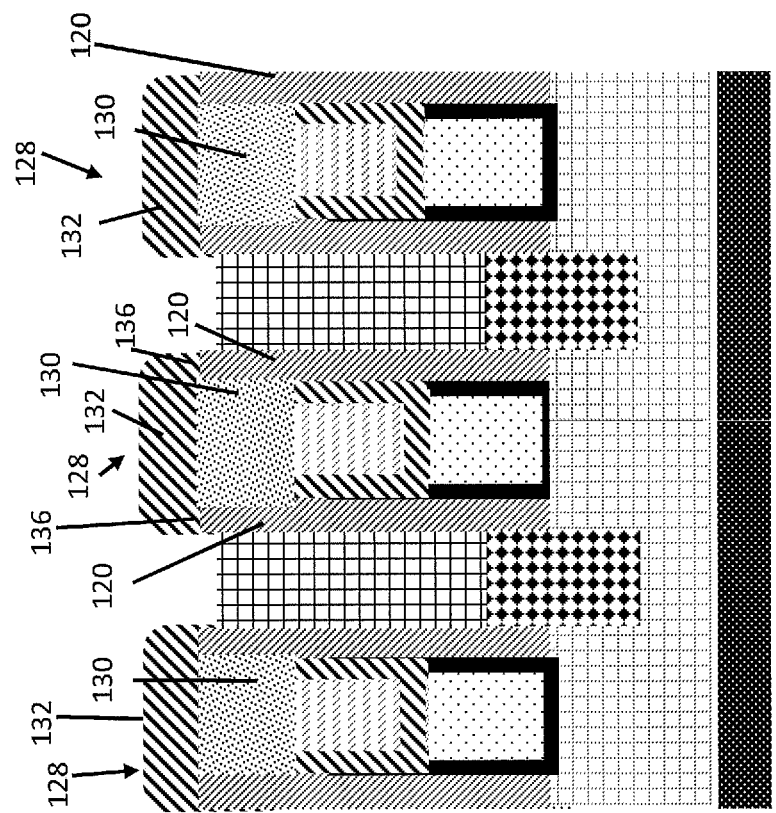

FIG. 5A shows forming a bulbous upper insulative cap portion 132 on each lower insulative cap portion 130 in at least the first region, shown in FIG. 3A. Lower insulative cap portion 130 may form an insulative cap 128 with or without bulbous upper insulative cap portion 132. In the FIGS. 5A-8B embodiments, and as shown in an initial step in FIG. 5B, a mask 134 may cover the second region during formation of bulbous upper insulative cap portion 132, i.e., where a gate contact is to be formed. In this manner, only the first region (FIG. 5A) between S/D regions 106, 108 includes bulbous upper insulative cap portion 132. That is, prior to forming bulbous upper insulative cap portion 132 (FIG. 5A), the process includes masking over second region (FIG. 5B) such that forming the bulbous upper insulative cap portion 132 (FIG. 5A) on each lower insulative cap portion 130 occurs only in the first region (FIG. 5A). Mask 134 may include, for example, silicon oxide (SiO$_2$). In all embodiments herein, bulbous upper insulative cap portion 132 may include silicon nitride (SiN), and may be selectively grown on lower insulative cap portion 130. In this fashion, bulbous upper insulative cap portion 132 may be integral with lower insulative cap portion 130, forming a collective insulative cap 128. It can be a unitary piece with no delineation therebetween, or two pieces coupled with a observable delineation therebetween. As shown in FIG. 5A, bulbous upper insulative cap portion 132 may extend above and over an upper end 136 of sidewall spacer 130. Bulbous upper insulative cap portion 132 may have a rounded top such that is forms a mushroom shaped cross-section with lower insulative cap portion 130, as shown in FIG. 5A.

Figure 6A:
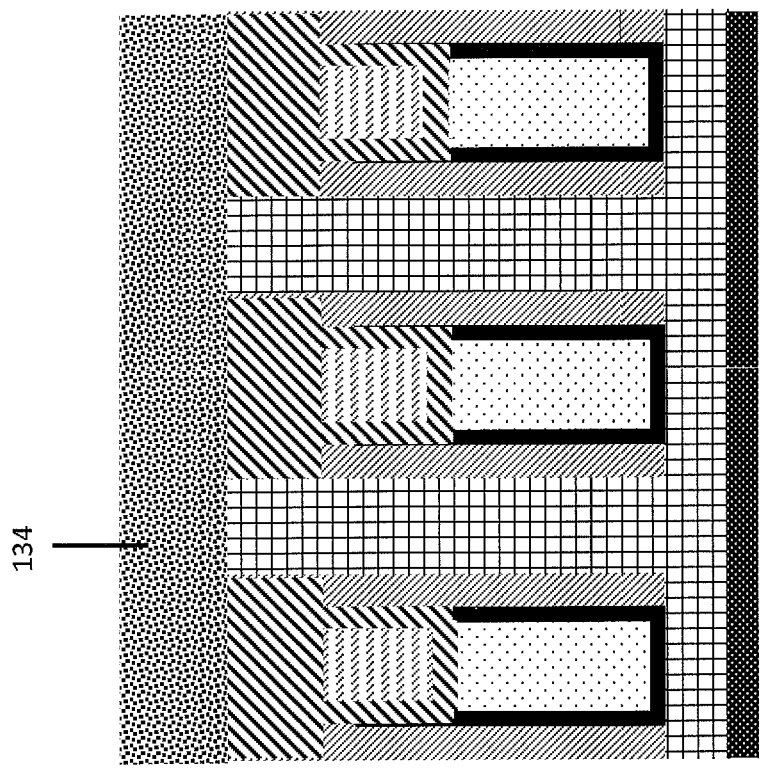
FIGS. 6A and 6B show cross-sectional views along line A-A and B-B, respectively, in FIG. 1, after part of a method according to embodiments of the disclosure.
Figure 6B:
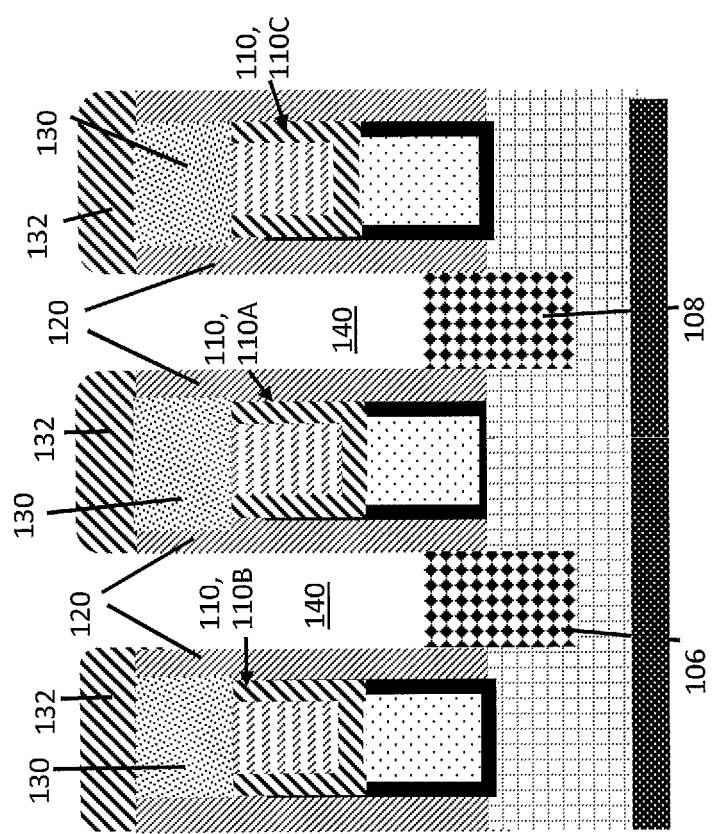

FIG. 6A shows forming self-aligned contact (SAC) openings 140 to each of first and second S/D regions 106, 108 by etching a trench silicide (TS) region from over each of first and second S/D regions 106, 108. The etching may include, for example, a RIE. Mask 134 prevents etching in the second region, shown in FIG. 6B. Here, in contrast to conventional techniques, bulbous upper insulative cap portion 132 prevents loss of gate 110 height. That is, bulbous upper insulative cap portion 132 provides additional material to resist etching gate 110 height, preserving gate height and maintaining low parasitic capacitance in the final device. During the etching, at least some of bulbous upper insulative portion 132 is removed. Bulbous upper insulative cap portion 132 does not impact the self-aligned nature of openings 140 to S/D regions 106, 108.

Figure 7B:
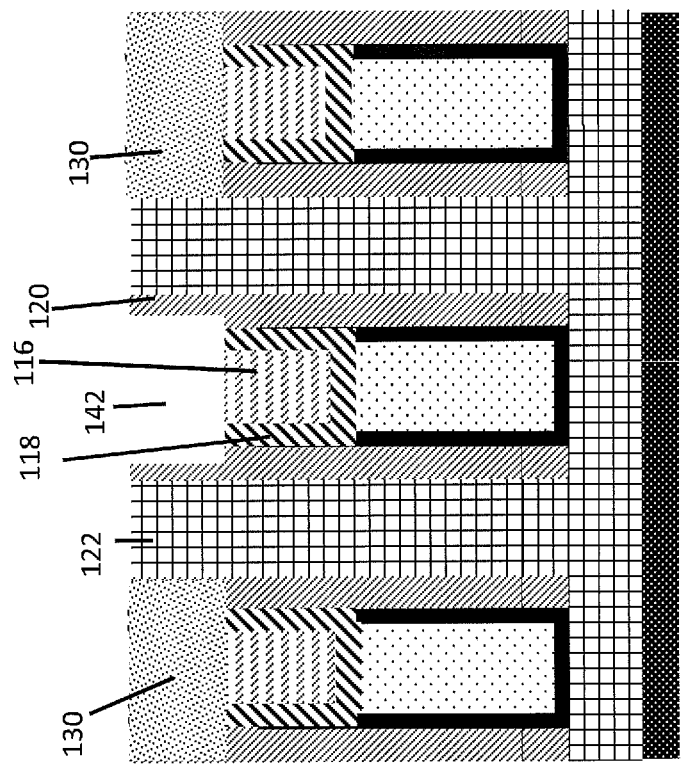
FIGS. 7A and 7B show cross-sectional views along line A-A and B-B, respectively, in FIG. 1, after part of a method according to embodiments of the disclosure.
Figure 7A:
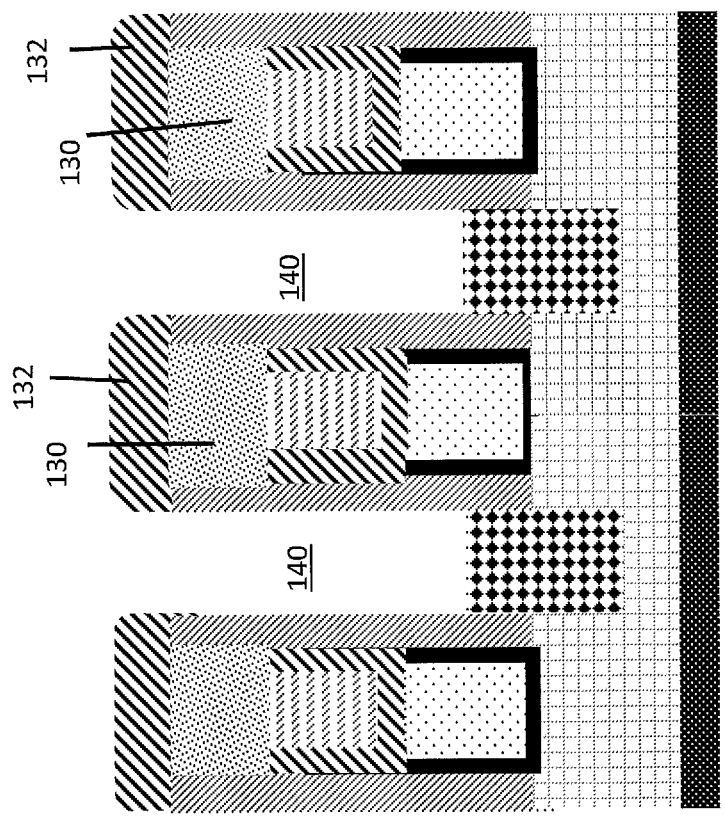

FIG. 7B shows forming a gate contact opening 142 by removing lower insulative cap portion 130 from over gate 110A in the second region. This step may include, for example, forming a mask (not shown) over the first region (FIG. 7A) and the second region (FIG. 7B) but exposing lower insulative cap portion 130 (FIG. 6B) over gate 110A, and etching. The etching may include, for example, a RIE.

FIGS. 8A and 8B show depositing a conductor 146 in SAC openings 140 and gate contact opening 142 to form SACs 150 to first and second S/D regions 106, 108, and form gate contact 152 to first gate 110A, respectively. Conductor 146 may include any now known or later developed metal conductor such as but not limited to copper, and may be formed by deposition and then planarization. Any necessary silicidation and/or liner deposition steps may be carried out prior to such deposition.

FIGS. 8A and 8B also show finFET structure 154, according to one embodiment of the disclosure. FinFET structure 154 may include semiconductor fin 102 on substrate 102, first S/D region 106 defined in semiconductor fin 102, and second S/D region 108 defined in the semiconductor fin 102 and spaced from first S/D region 106. FinFET structure 154 may also include a first, second and third gate 110A, 110B, 110C extending across semiconductor fin 102. It is noted that only first gate 110A forms part of the active finFET. Each gate 110 includes WFM 112 having metal plug 116 in barrier liner 117 thereover. First gate 110A extends across semiconductor fin 102 between first and second S/D regions 106, 108, forming channel 117 for the active finFET. Sidewall spacer 120 is positioned about first gate 110A. In this embodiment, sidewall spacer 120 extends beyond an upper surface 156 of metal plug 116 and barrier liner 118. A first SAC 150A extends to first S/D region 106 between first gate 110A and second gate 110B (second gate inactive here), and a second SAC 150B extends to second S/D region 108 between first gate 110A and third gate 110C (third gate inactive here). First insulative caps 128 over each gate 110 in a vicinity of first SAC 150A and second SAC 150B, i.e., near S/D regions 106, 108, include bulbous upper insulative cap portion 132. In contrast, in the FIG. 8B embodiment, insulative caps 128 in a vicinity of gate contact 152 do not include bulbous upper insulative cap portion 132 (FIG. 8A), but only lower insulative cap portion 130. Where provided, bulbous upper insulative cap portion 132 extends over upper end 136 of an adjacent sidewall spacer 120. Lower insulative cap portion 128 extends into sidewall spacer 120, forming the mushroom shaped cross-section, where provided, with bulbous upper insulative cap portion 132.

In FIG. 8B, gate contact 152 for first gate 110A is at a distance from first and second S/D regions 106, 108, i.e., it is not laterally aligned with SACs 150A, 150B—see FIG. 1 in phantom. Here, FinFET structure 154 includes a second insulative cap 128A over second gate 110B in a vicinity of the gate contact 152, and a third insulative cap 128B over third gate 110C in the vicinity of the gate contact 152. Each of the second and third insulative caps 128A, 128B have a planar upper surface, i.e., they do not include bulbous upper insulative cap portion 132 (FIG. 8A) because they were planarized.

Referring to FIGS. 9A and 9B through FIGS. 11A and 11B, another embodiment of the disclosure is shown. FIGS. 9A and 9B depict a process which occurs after the step shown in FIGS. 3A and 3B, and show forming gate plug recess 226 in at least metal plug 116 and barrier liner 118 within sidewall spacer 120 over gate 110, but also shows recessing sidewall spacer 120. That is, gate plug recess 226 extends over sidewall spacer 120, not just metal plug 116 and barrier liner 118, as in FIGS. 3A and 3B. Processing thereafter may proceed as described relative to FIGS. 4A-B through FIGS. 8A-B, resulting in a finFET structure 254, as shown in FIGS. 11A and 11B. FIGS. 10A and 10B show processing after forming lower insulative cap portion 230 in gate plug recess 226 in at least metal plug 116 and barrier liner 118 within sidewall spacer 120 over gate 110 in each of: the first region (FIG. 10A) between first and second S/D regions 106, 108, and the second region (FIG. 10B) including the location for gate contact 152 (FIG. 11B). Here, lower insulative cap portion 230 extends over upper ends 136 of sidewall spacer 120. FIGS. 11A and 11B show FinFET structure 254 after forming: bulbous upper insulative cap portion 230 (e.g., by selectively growing SiN), SACs 150A, 150B, and gate contact 152, as described relative to FIGS. 5A-B through FIGS. 8A-B. FinFET structure 254 is substantially similar to finFET structure 154 in FIGS. 8A and 8B, except insulative cap 228 is not mushroom shaped because lower insulative cap portion 230 has the same width as a bulbous upper insulative cap portion 232 thereof. In this embodiment, as shown in FIG. 11A, forming SAC openings 140 (e.g., as shown in FIG. 6A) may result in removing bulbous upper insulative cap portion 232 (or simply more thereof) on each insulative cap 228 in the first region.

Figure 12B:
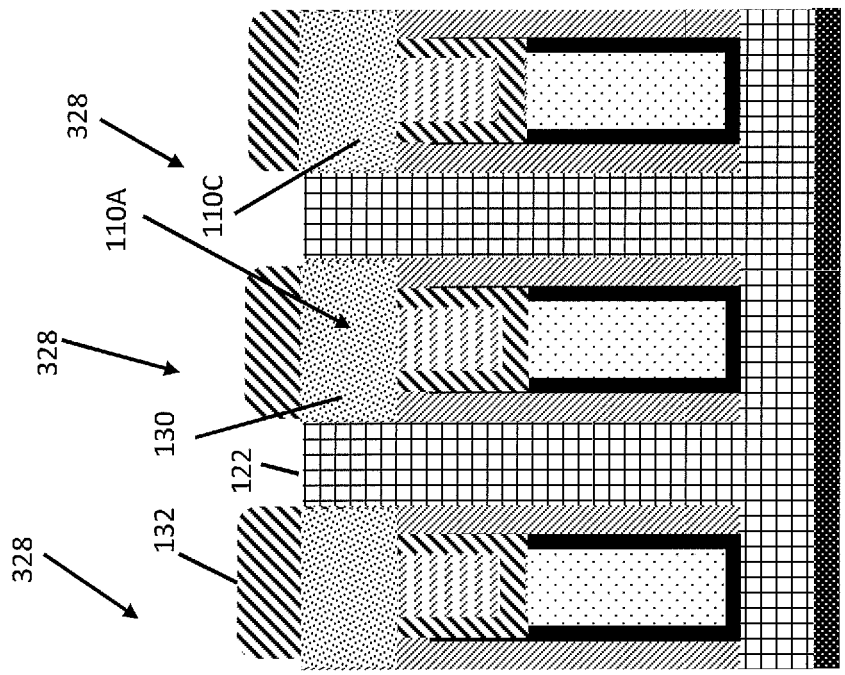
FIGS. 12A and 12B show cross-sectional views along line A-A and B-B, respectively, in FIG. 1, after part of a method according to embodiments of the disclosure.
Figure 12A:
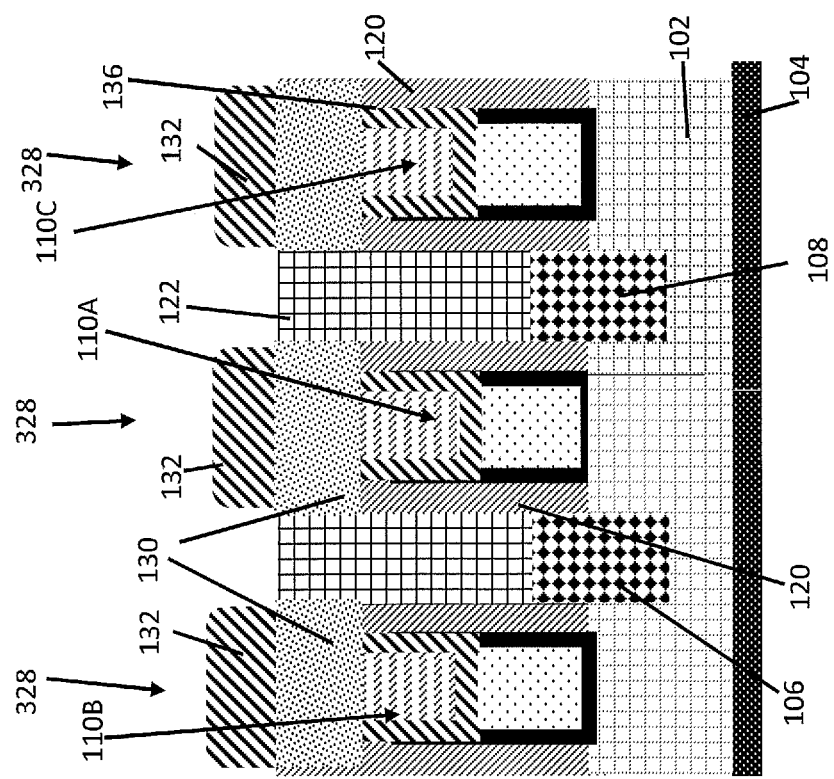

FIGS. 12A and 12B show another embodiment of a method of forming a finFET structure that starts from the structure shown in FIGS. 10A and 10B, i.e., with lower insulative cap portion 230 extending over upper ends 136 of sidewall spacer 120. In this embodiment, in contrast to the process of FIGS. 5B and 6B (also applied to FIGS. 10A-10B to FIGS. 11A-11B), the second region (FIG. 12B) is not masked during formation of bulbous upper insulative cap portion 132. Consequently, forming bulbous upper insulative cap portion 132 on each lower insulative cap portion 130 occurs in the first region (FIG. 12A) and the second region (FIG. 12B). An insulative cap 328 with lower insulative cap portion 130 and bulbous upper insulative cap portion 132 in the vicinity of S/D regions 106, 108, and in the vicinity of gate contact 152 (FIG. 16B) is the eventual result. Since sidewall spacer 120 was also etched after formation of the gate plug recess, forming wider gate plug recess 226 (FIGS. 9A and 9B), insulative cap 328 extends over upper end 136 of sidewall spacer 120 in this embodiment.

Figure 13B:
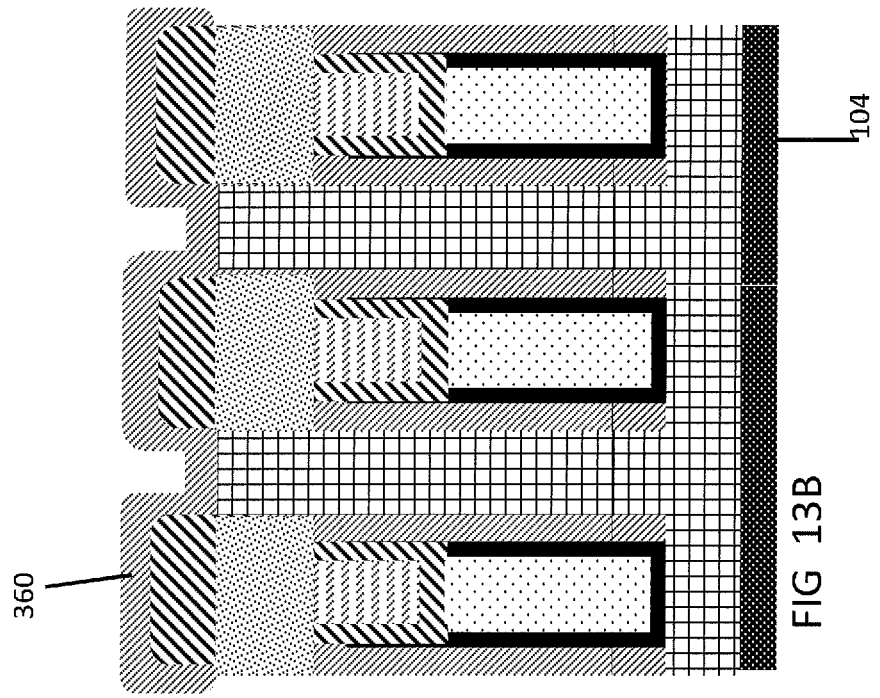
FIGS. 13A and 13B show cross-sectional views along line A-A and B-B, respectively, in FIG. 1, after part of a method according to embodiments of the disclosure.
Figure 13A:
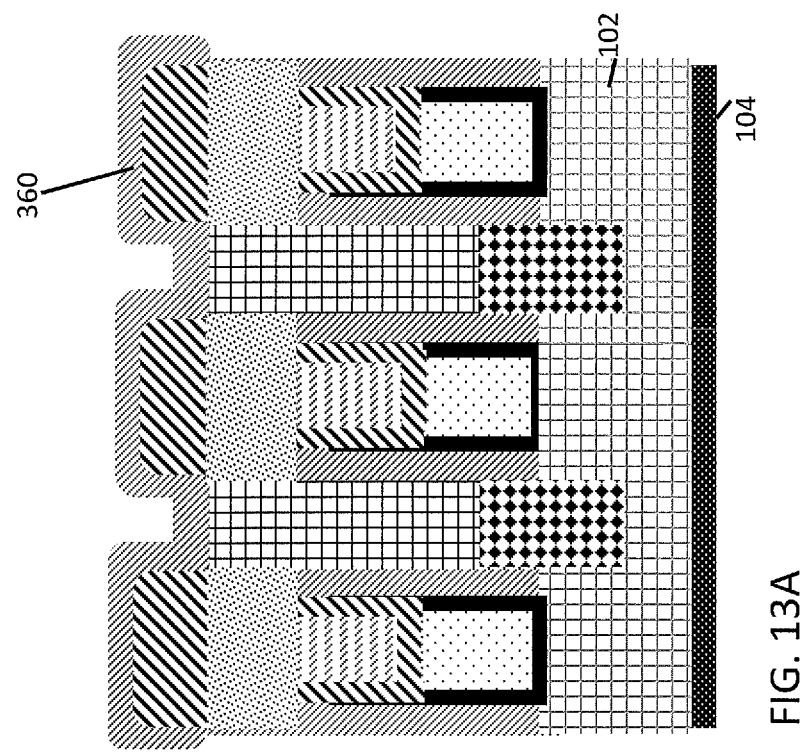
Figure 14B:
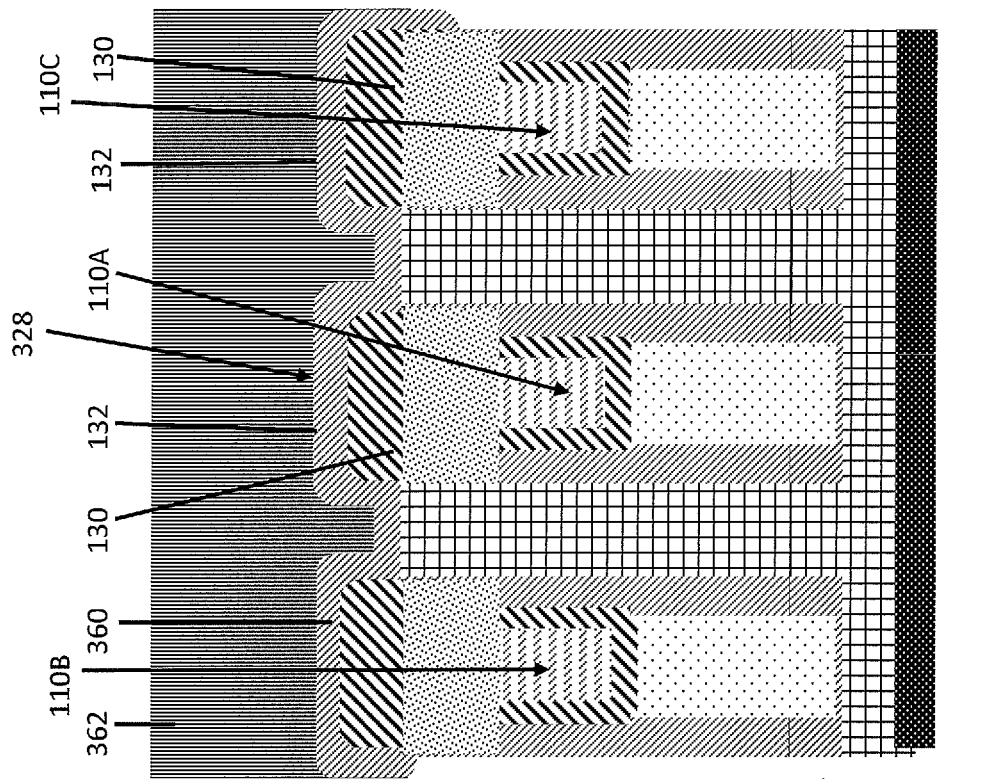
FIGS. 14A and 14B show cross-sectional views along line A-A and B-B, respectively, in FIG. 1, after part of a method according to embodiments of the disclosure.
Figure 14A:
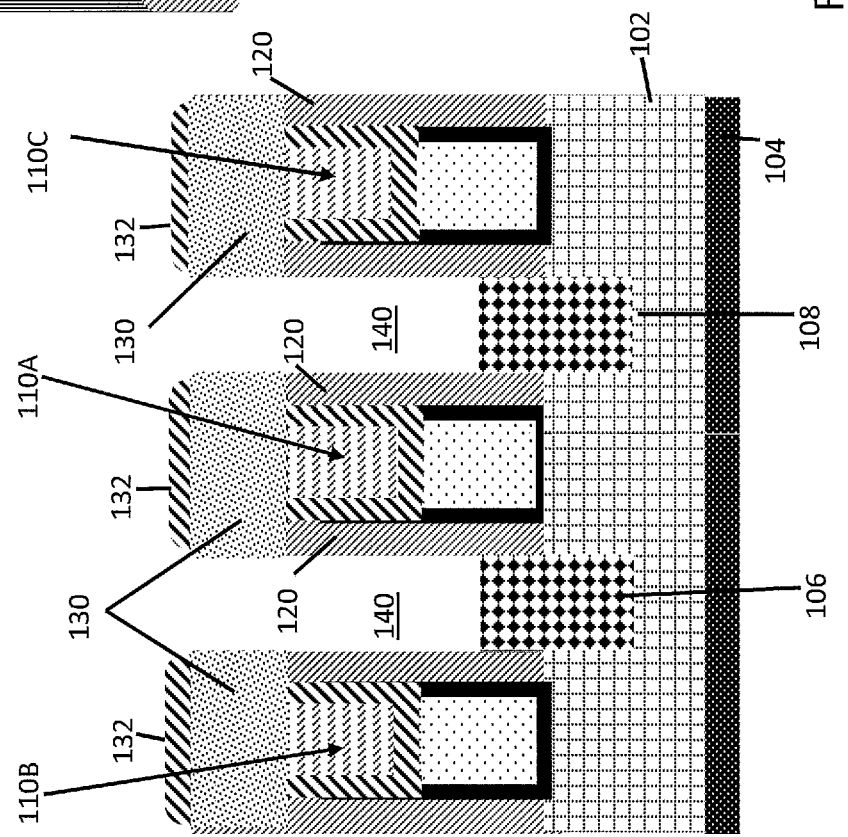
Figure 15B:
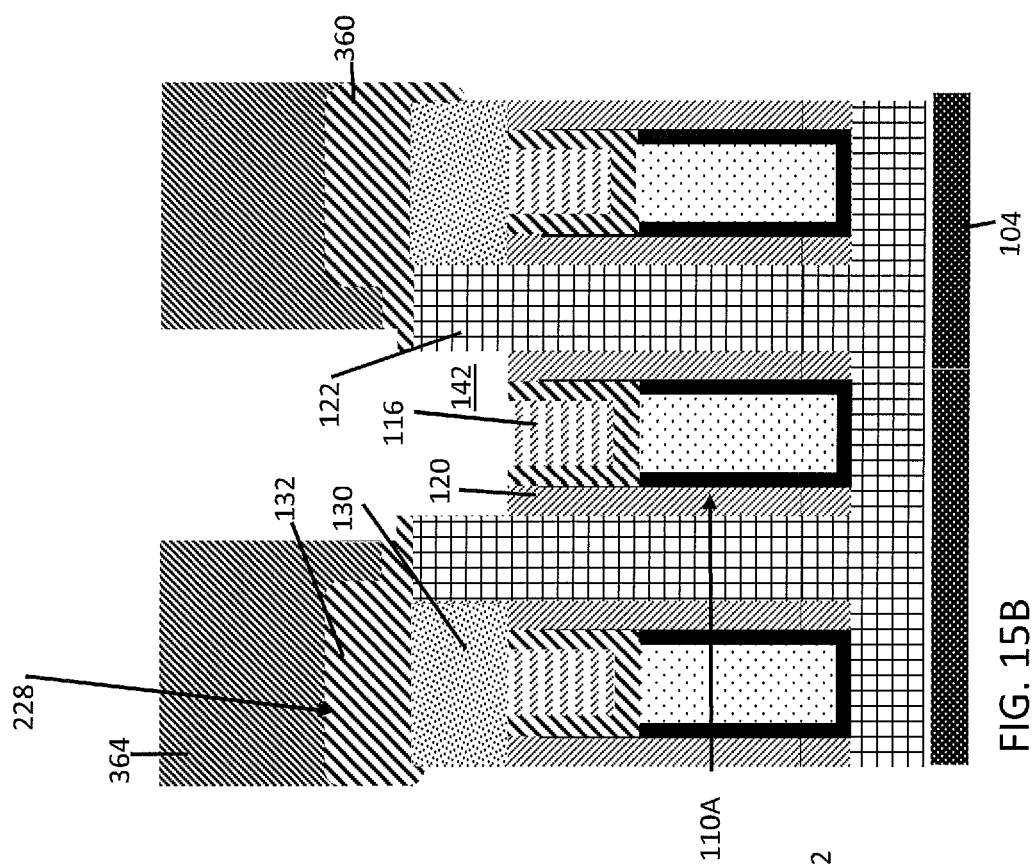
FIGS. 15A and 15B show cross-sectional views along line A-A and B-B, respectively, in FIG. 1, after part of a method according to embodiments of the disclosure.
Figure 15A:
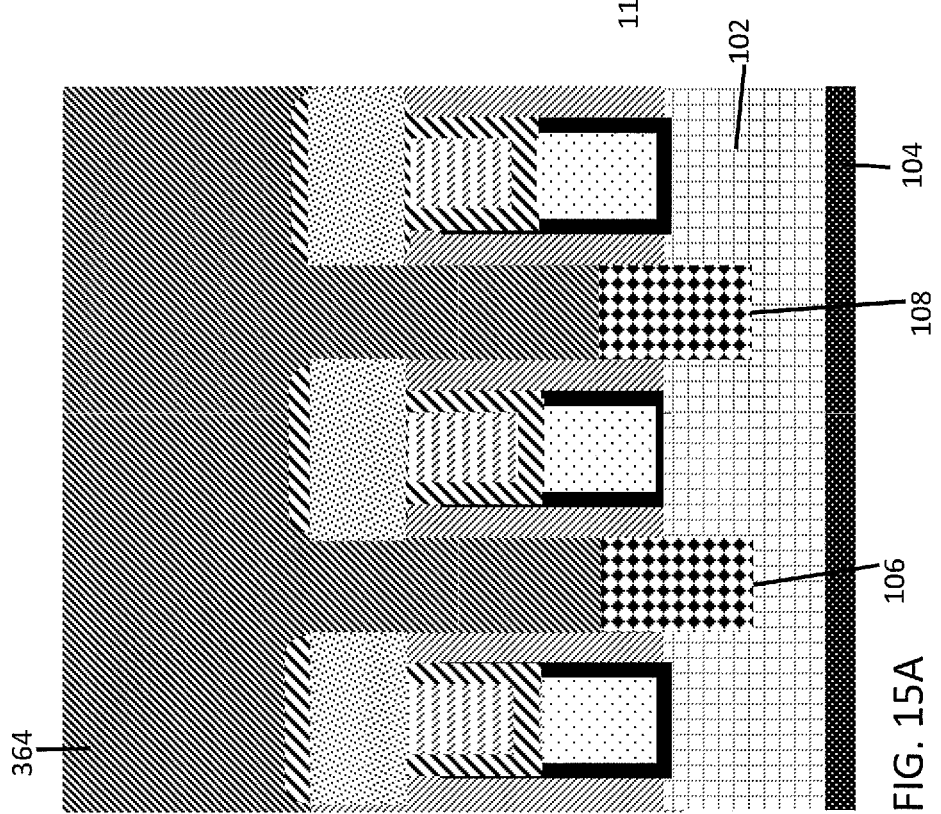

As shown in FIGS. 13A and 13B, in contrast to earlier embodiments, this embodiment also may include forming an oxide mask 360 over the first region (FIG. 13A) and the second region (FIG. 13B), prior to forming self-aligned contact (SAC) openings (FIG. 14A). FIG. 14B also shows masking the second region with a mask 362, prior to forming self-aligned contact (SAC) openings (FIG. 14A). In this embodiment, oxide mask 360 acts to further protect gate 110 height. FIG. 14A shows forming self-aligned contact (SAC) openings 140 to each of first and second S/D regions 106, 108 by etching a trench silicide (TS) region from over each of first and second S/D regions 106, 108. The etching may include, for example, a RIE. Mask 362 prevents etching in second region, shown in FIG. 14B. Here, as in previous embodiments, bulbous upper insulative cap portion 132 prevents loss of gate 110 height. That is, bulbous upper insulative cap portion 132 provides additional material to resist etching gate 110 height, preserving gate height and maintaining low parasitic capacitance. During the etching, at least some of bulbous upper insulative portion 132 is removed. Bulbous upper insulative cap portion 132 does not impact the self-aligned nature of openings 140 to S/D regions 106, 108. Mask 362 may be removed after this step, e.g., using an ashing process. FIG. 15B shows forming a gate contact opening 142 by removing lower insulative cap portion 130 from over gate 110A in the second region. This step may include, for example, forming a mask 364 over the first region (FIG. 15A) and the second region (FIG. 15B) but exposing insulative cap 328 (FIG. 14B) over gate 110A, and etching. The etching may include, for example, a RIE. Masks 362 and 364 may use any now known or later developed mask material, e.g., silicon nitride.

FIGS. 16A and 16B show depositing a conductor 146, planarizing the bulbous upper insulative cap portions 132 and the conductor to remove excess conductor. The planarizing also removes bulbous upper insulative cap portions 132 in the first region (FIG. 15A) and the second region (FIG. 15B). Here, bulbous upper insulative cap portions 132 are not present in the finFET structure 354. However, an insulative cap 428, now only including lower insulative cap portion 130, extends over upper end 136 of sidewall spacer 120 in this embodiment in both first and second regions.

Figure 17B:
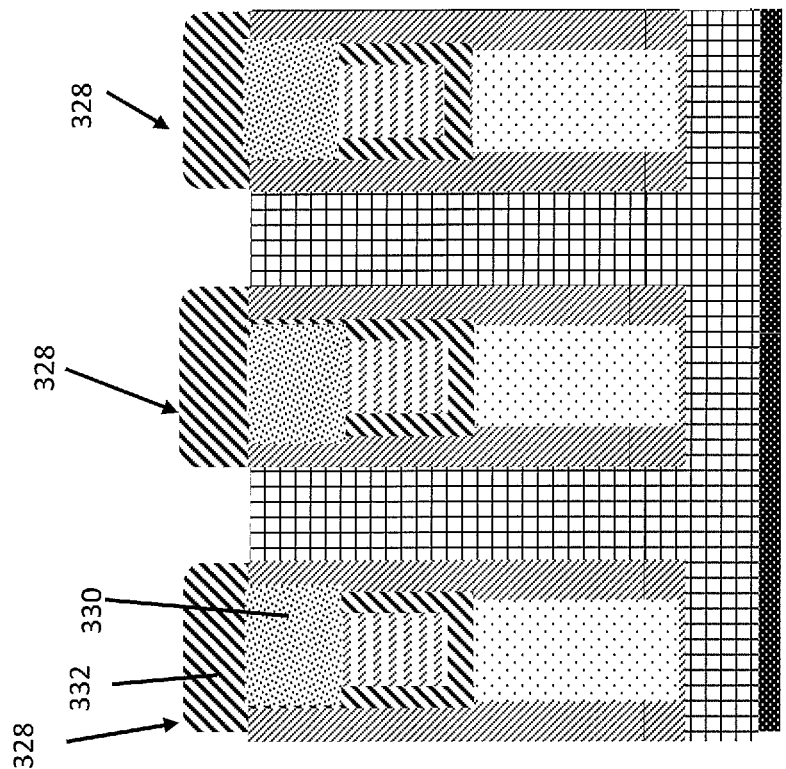
FIGS. 17A and 17B show cross-sectional views along line A-A and B-B, respectively, in FIG. 1, after part of a method according to embodiments of the disclosure.
Figure 17A:
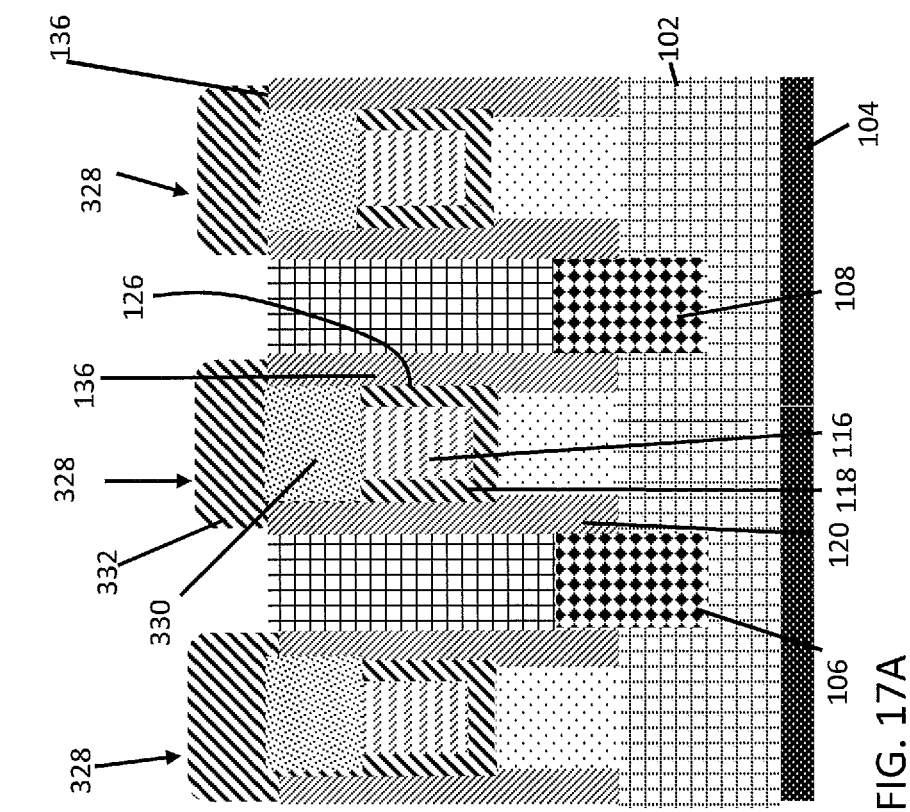

FIGS. 17A and 17B through FIGS. 21A and 21B show another embodiment in which sidewall spacer 120 is not removed as part of forming the gate plug recess, resulting in insulative cap 328 having a mushroom shaped cross-section with a bulbous upper insulative cap portion 332 and a lower insulative cap portion 330. Each bulbous upper insulative cap portion 332 overlaps an upper end 136 of sidewall spacer 120, similarly to FIG. 5A. In addition, as shown in FIGS. 17A and 17B, in this embodiment, forming bulbous upper insulative cap portion 332 occurs in the first region (FIG. 17A) and the second region (FIG. 17B), similarly to FIGS. 12A and 12B. This embodiment may also use an oxide mask 460, similar to that described relative to FIGS. 13A-B through FIGS. 15A-B.

Figure 18B:
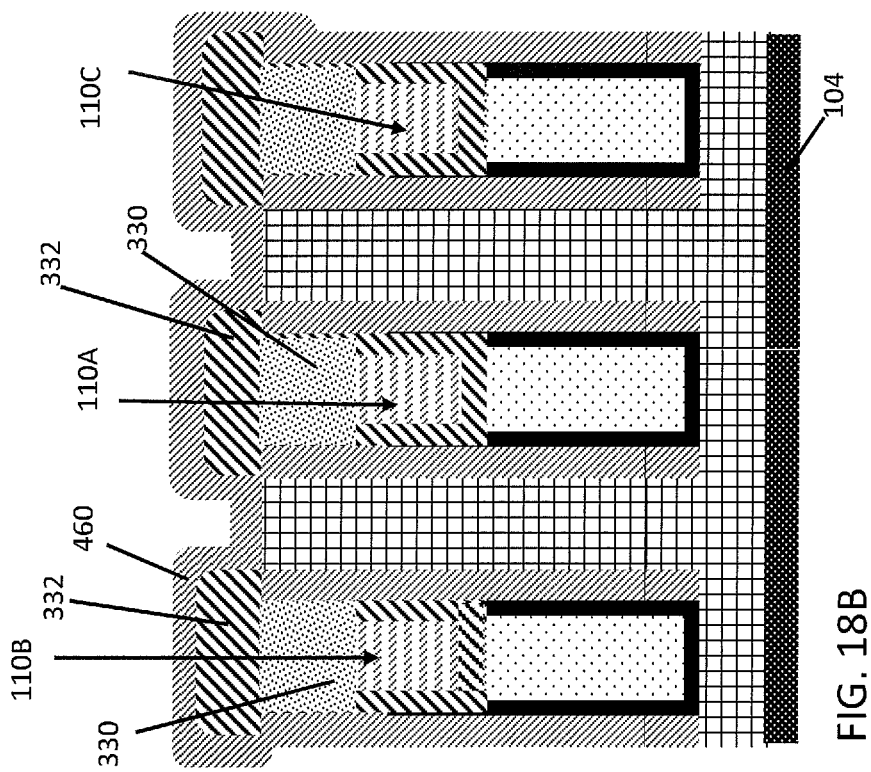
FIGS. 18A and 18B show cross-sectional views along line A-A and B-B, respectively, in FIG. 1, after part of a method according to embodiments of the disclosure.
Figure 18A:
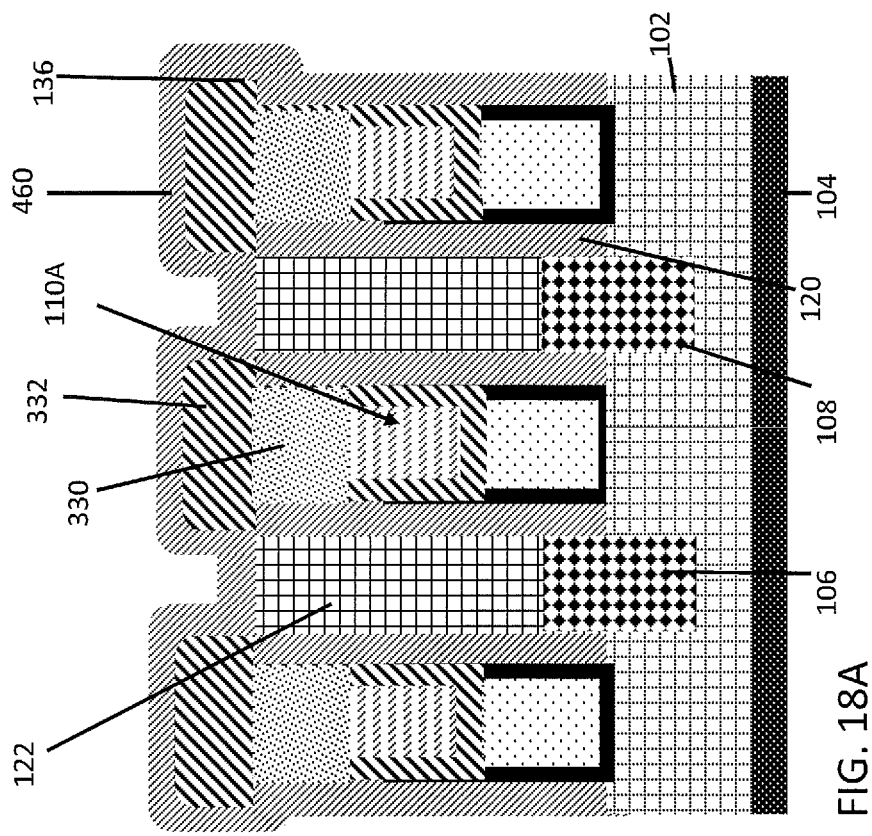

FIGS. 18A and 18B show forming an oxide mask 460 over the first region (FIG. 18A) and the second region (FIG. 18B), prior to forming self-aligned contact (SAC) openings 140 (FIG. 19A). FIG. 19B shows masking the second region with a mask 462 prior to forming self-aligned contact (SAC) openings 140 (FIG. 19A). In this embodiment, oxide mask 460 acts to further protect gate 110 height. FIG. 19A shows forming self-aligned contact (SAC) openings 140 to each of first and second S/D regions 106, 108 by etching a trench silicide (TS) region from over each of first and second S/D regions 106, 108. The etching may include, for example, a RIE. Mask 462 prevents etching in second region, shown in FIG. 19B. Here, as in previous embodiments, bulbous upper insulative cap portion 332 prevents loss of gate 110 height. That is, bulbous upper insulative cap portion 332 provides additional material to resist etching gate 110 height, preserving gate height and maintaining low parasitic capacitance. During the etching, at least some of bulbous upper insulative portion 332 is removed. Bulbous upper insulative cap portion 332 does not impact the self-aligned nature of openings 140 to S/D regions 106, 108. Mask 462 may be removed at this stage, e.g., using an ashing process.

FIG. 20B shows forming a gate contact opening 142 by removing lower insulative cap portion 330 from over gate 110A in the second region. This step may include, for example, forming a mask 464 over the first region (FIG. 20A) and the second region (FIG. 20B) but exposing insulative cap 328 (FIG. 19B) over gate 110A, and etching. The etching may include, for example, a RIE. Masks 462 and 464 may use any now known or later developed mask material, e.g., silicon nitride.

Figure 21B:
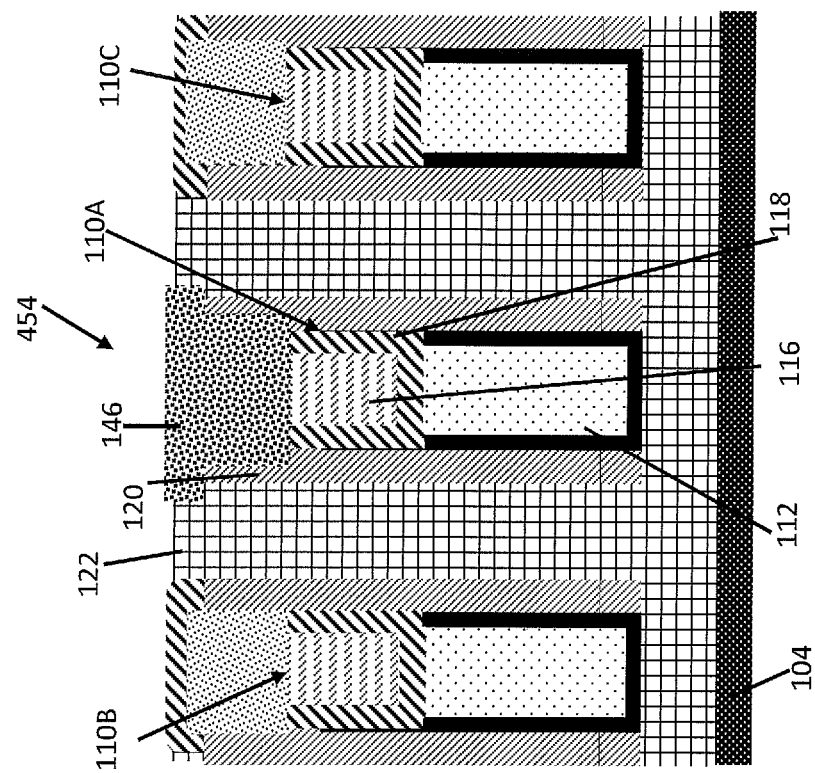
FIGS. 21A and 21B show cross-sectional views along line A-A and B-B, respectively, in FIG. 1, after part of a method, and a finFET structure, according to embodiments of the disclosure.
Figure 21A:
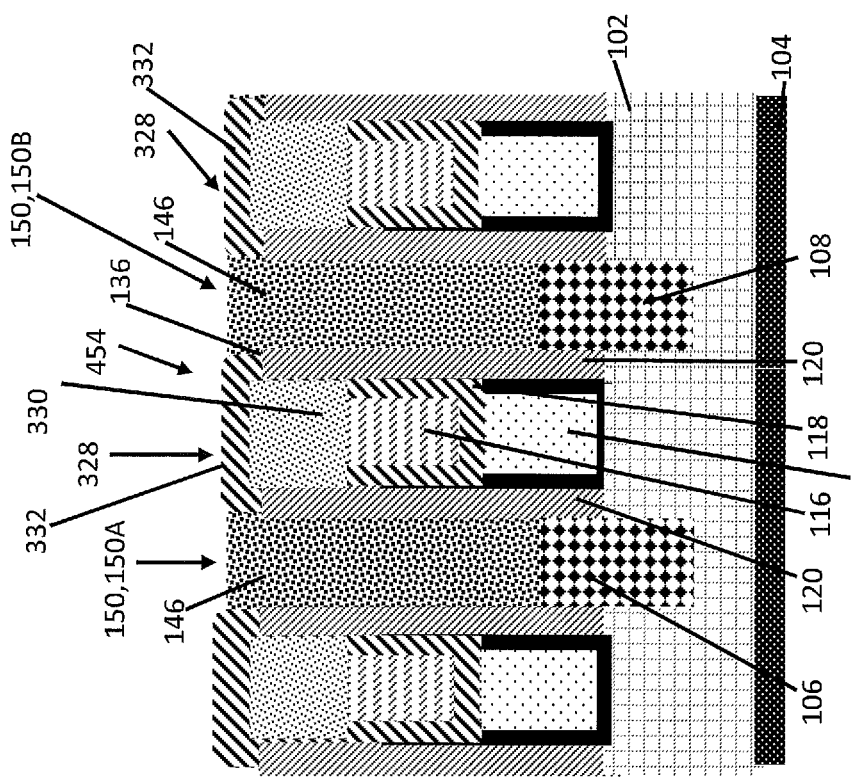

FIGS. 21A and 21B show depositing a conductor 146, planarizing the bulbous upper insulative cap portions 332 and the conductor to remove excess conductor and the bulbous upper insulative cap portions 332 in the first region (FIG. 21A) and the second region (FIG. 21B). Here, bulbous upper insulative cap portions 132 remain only in the first region (FIG. 21A) of the finFET structure 454. FinFET structure 454 is substantially similar to finFET structure 154 (FIGS. 8A-B) except bulbous upper insulative cap portion 332 may be not as high.

Embodiments of the disclosure provide a method of protecting gate height with a thicker silicon nitride insulative cap. The finFET structure exhibits low parasitic capacitance due to the as-designed gate heights being preserved.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A fin-type field effect transistor (finFET) structure, comprising:
   a semiconductor fin on a substrate;
   a first source/drain (S/D) region defined in the semiconductor fin;
   a second source/drain (S/D) region defined in the semiconductor fin, the second S/D region spaced from the first source/drain region;
   a first, second and third gate extending across the semiconductor fin, each gate including a work function metal having a metal plug in a barrier liner thereover, wherein the first gate extends across the semiconductor fin between the first source/drain region and the second source/drain region;
   a sidewall spacer about the first gate;
   a first self-aligned contact (SAC) extending to the first source/drain region between the first and second gate;
   a second self-aligned contact (SAC) extending to the second source/drain region between the first and third gate; and
   a first silicon nitride (SiN) insulative cap over each gate in a vicinity of the first SAC and the second SAC, the first insulative cap having a bulbous upper insulative cap portion;
   a gate contact to the first gate at a distance from the first and second S/D regions;
   a second silicon nitride (SiN) insulative cap over the second gate in a vicinity of the gate contact; and
   a third silicon nitride (SiN) insulative cap over the third gate in the vicinity of the gate contact,
   wherein each of the second and third SiN insulative caps have a selectively grown SiN bulbous upper insulative cap portion.

2. The finFET structure of claim 1, wherein the sidewall spacer extends beyond an upper surface of the metal plug and the barrier liner.

3. The finFET structure of claim 2, wherein the first insulative cap further includes a lower insulative cap portion extending from the bulbous upper insulative cap portion into the sidewall spacer, and wherein the bulbous upper insulative cap portion extends over an upper end of the sidewall spacer.

4. A fin-type field effect transistor (finFET) structure, comprising:
   a semiconductor fin on a substrate;
   a first source/drain (S/D) region defined in the semiconductor fin;
   a second source/drain (S/D) region defined in the semiconductor fin, the second S/D region spaced from the first source/drain region;
   a first, second and third metal gate extending across the semiconductor fin, each metal gate including a work function metal having a tungsten plug in a titanium nitride (TiN) barrier liner thereover, wherein the first metal gate extends across the semiconductor fin between the first source/drain region and the second source/drain region;
   a silicon nitride sidewall spacer about the first metal gate;
   a first self-aligned contact (SAC) extending to the first source/drain region between the first and second metal gate;
   a second self-aligned contact (SAC) extending to the second source/drain region between the first and third metal gate;
   a first silicon nitride (SiN) insulative cap over each metal gate in a vicinity of the first SAC and the second SAC, wherein the first (SiN) insulative cap has a selectively grown SiN bulbous upper insulative cap portion;
   a gate contact to the first metal gate at a distance from the first and second S/D regions;
   a second silicon nitride (SiN) insulative cap over the second metal gate in a vicinity of the gate contact; and
   a third silicon nitride (SiN) insulative cap over the third metal gate in the vicinity of the gate contact,
   wherein each of the second and third SiN insulative caps have a selectively grown SiN bulbous upper insulative cap portion.

5. The finFET structure of claim 4, wherein the SiN sidewall spacer extends beyond an upper surface of the metal plug and the TiN barrier liner.

6. The finFET structure of claim 4, wherein each SiN insulative cap further includes a lower insulative cap portion extending into the sidewall spacer.

7. The finFET structure of claim 4, wherein each bulbous upper insulative cap portion extends over an upper end of an adjacent sidewall spacer.

8. A method comprising:
provyiding a preliminary structure including:
  a semiconductor fin on a substrate,
  a first source/drain (S/D) region defined in the semiconductor fin,
  a second source/drain (S/D) region defined in the semiconductor fin, the second S/D region spaced from the first source/drain region,
  a gate extending across the fin, the gate including a work function metal having a metal plug in a barrier liner thereover, wherein the gate extends across the semiconductor fin between the first S/D region and the second S/D region, and
  a sidewall spacer about the gate;
forming a gate plug recess in at least the metal plug and the barrier liner within the sidewall spacer over the gate in each of: a first region between the first and second S/D regions, and a second region including a location for a gate contact;
forming a lower insulative cap portion over each gate plug recess, and planarizing;
forming a bulbous upper insulative cap portion on each lower insulative cap portion in at least the first region;
forming self-aligned contact (SAC) openings to each of the first and second S/D regions by etching from over each of the first and second S/D regions;
forming a gate contact opening by removing the lower insulative cap portion from over the gate in the second region; and
depositing a conductor in the SAC openings and the gate contact opening to form SACs to the first and second S/D regions and the gate contact to the first gate.

9. The method of claim 8, further comprising, prior to forming the bulbous upper insulative cap portion, masking over the second region such that forming the bulbous upper insulative cap portion on each lower insulative cap portion occurs only in the first region.

10. The method of claim 9, wherein forming the gate plug recess in at least the metal plug and the barrier liner within the sidewall spacer over the gate further includes recessing the sidewall spacer.

11. The method of claim 10, wherein forming the SAC openings removes the bulbous upper insulative cap portion on each lower insulative cap portion in the first region.

12. The method of claim 8, wherein the forming the bulbous upper insulative cap portion on each lower insulative cap portion in at least the first region includes forming the bulbous upper insulative cap portion on each lower insulative cap portion in the first region and the second region.

13. The method of claim 12, further comprising:
prior to forming self-aligned contact (SAC) openings:
  forming an oxide mask over the first region and the second region, and masking the second region; and
after depositing the conductor, planarizing the bulbous upper insulative cap portions and the conductor to remove excess conductor and the bulbous upper insulative cap portions in the first region and the second region.

14. The method of claim 8, wherein the forming the bulbous upper insulative cap portion on each lower insulative cap portion in at least the first region includes forming the bulbous upper insulative cap portion on each lower insulative cap portion in the first region and the second region.

15. The method of claim 14, further comprising:
prior to forming self-aligned contact (SAC) openings:
  forming an oxide mask over the first region and the second region, and masking the second region; and
after depositing the conductor, planarizing the bulbous upper insulative cap portions and the conductor to remove excess conductor and the bulbous upper insulative cap portions in the second region.

16. The method of claim 8, wherein the lower insulative cap portion includes silicon nitride, and the forming the bulbous upper insulative cap portion on each lower insulative cap portion includes selectively growing silicon nitride.

17. The method of claim 8, wherein the forming the lower insulative cap portion over each gate plug recess includes depositing silicon nitride, and the forming the bulbous upper insulative cap portion on each lower insulative cap portion includes selectively growing silicon nitride on the respective lower insulative cap portion.

18. The method of claim 8, wherein the bulbous upper insulative cap portion protects a height of the gate and the gate plug during the forming the SAC openings to each of the first and second S/D regions by etching from over each of the first and second S/D regions.

* * * * *